US008546738B2

(12) United States Patent
Fukushima

(10) Patent No.: US 8,546,738 B2
(45) Date of Patent: Oct. 1, 2013

(54) PHYSICAL QUANTITY DISTRIBUTION DETECTOR HAVING A PLURALITY OF UNIT COMPONENTS WITH SENSITIVITY TO A PHYSICAL QUANTITY CHANGE OF LIGHT

(75) Inventor: Noriyuki Fukushima, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/232,590

(22) Filed: Sep. 14, 2011

(65) Prior Publication Data

US 2012/0002088 A1    Jan. 5, 2012

Related U.S. Application Data

(60) Continuation of application No. 12/263,610, filed on Nov. 3, 2008, now Pat. No. 8,035,076, which is a division of application No. 11/277,050, filed on Mar. 21, 2006, now Pat. No. 7,847,233.

(30) Foreign Application Priority Data

Mar. 23, 2005  (JP) ................................ 2005-083048

(51) Int. Cl.
   *H01L 31/00*   (2006.01)
(52) U.S. Cl.
   USPC ............. 250/214.1; 250/214 DC; 341/157
(58) Field of Classification Search
   USPC ........... 250/214.1, 214 DC, 214 R; 341/155, 341/157, 167; 257/431
   See application file for complete search history.

(56) References Cited

U.S. PATENT DOCUMENTS

| 3,634,854 | A | 1/1972 | Anderson |
| 4,519,391 | A | 5/1985 | Murakoshi |
| 6,278,398 | B1 | 8/2001 | Vossiek et al. |
| 6,821,809 | B2 * | 11/2004 | Abe et al. ................. 438/65 |
| 2003/0189657 | A1 * | 10/2003 | Hammadou ............ 348/294 |
| 2004/0029550 | A1 | 2/2004 | Kishi |
| 2005/0145773 | A1 * | 7/2005 | Hashimoto et al. ...... 250/203.6 |
| 2005/0225649 | A1 | 10/2005 | Shinotsuka |
| 2006/0043509 | A1 * | 3/2006 | Watkins et al. .......... 257/431 |

FOREIGN PATENT DOCUMENTS

| JP | 58-069528 | 4/1983 |
| JP | 03-061823 | 3/1991 |
| JP | 05-184127 | 7/1993 |
| JP | 10-022489 | 1/1998 |

(Continued)

OTHER PUBLICATIONS

Japanese Office Action dated Apr. 17, 2012 for Japanese Application No. 2010-201412.

*Primary Examiner* — Francis M Legasse, Jr.
(74) *Attorney, Agent, or Firm* — Sheridan Ross P.C.

(57) ABSTRACT

A physical information acquiring method of acquiring physical information for a predetermined purpose on the basis of change information that is acquired under predetermined detection conditions for a physical quantity using an portion for physical quantity distribution detection. The portion for physical quantity distribution detection includes a detector that detects change information corresponding to a change in a physical quantity made incident on the detector and has unit components that output unit signals based on the change information detected by the detector arranged in a predetermined order. In the physical information acquiring method, a carrier signal is converted into a signal related to a frequency on the basis of the change information detected by the detector. The physical information for a predetermined purpose is acquired using the signal related to a frequency.

10 Claims, 15 Drawing Sheets

(56) References Cited

FOREIGN PATENT DOCUMENTS

| JP | 10-227815 | 8/1998 |
|----|-----------|--------|
| JP | 2001-054022 | 2/2001 |
| JP | 2003-219279 | 7/2003 |
| JP | 2004-015298 | 1/2004 |
| JP | 2004-040186 | 5/2004 |
| JP | 2004-158940 | 6/2004 |
| JP | 2005-227155 | 8/2005 |

* cited by examiner

US 8,546,738 B2

PHYSICAL QUANTITY DISTRIBUTION DETECTOR HAVING A PLURALITY OF UNIT COMPONENTS WITH SENSITIVITY TO A PHYSICAL QUANTITY CHANGE OF LIGHT

RELATED APPLICATION DATA

This application is a continuation of U.S. patent application Ser. No. 12/263,610, filed Nov. 3, 2008, which is a division of U.S. patent application Ser. No. 11/277,050, filed Mar. 21, 2006, the entirety of which is incorporated herein by reference to the extent permitted by law. The present invention claims priority to Japanese Patent Application No. 2005-083048 filed in the Japanese Patent Office on Mar. 23, 2005, the entirety of which also is incorporated by reference herein to the extent permitted by law.

BACKGROUND OF THE INVENTION

The present invention relates to a physical quantity distribution detector, a physical information acquiring method, and a physical information acquiring device. More specifically, the invention relates to a technology for acquiring information for predetermined purposes that is suitable in using a portion for physical quantity distribution detection (a physical quantity distribution detector) such as a solid-state imaging device that has plural unit components, which have sensitivity to electromagnetic waves inputted from the outside such light and radiations, arranged therein and is capable of reading out a physical quantity distribution converted into an electric signal by the unit components as the electronic signal. In particular, the invention relates to a noise resistance property in transmitting an analog signal detected by a detector to an output side directly as the analog signal or after converting the analog signal into digital data.

Physical quantity distribution detecting semiconductor devices having plural unit components (e.g., pixels) arranged in a line shape of a matrix shape are used in various fields. The unit components have sensitivity to a physical quantity change of light and electromagnetic waves inputted from the outside such as radiations or pressures (by contact or the like).

As an example, in the field of video equipment, solid-state imaging devices are used. The solid-state imaging devices use imaging devices of a Charge Coupled Device (CCD) type or a Metal Oxide Semiconductor (MOS) or Complementary Metal-Oxide Semiconductor (CMOS) type that detect a change in light (an example of electromagnetic waves) that is an example of a physical quantity.

In the field of computer equipment, fingerprint authentication apparatuses and the like are used. The fingerprint authentication apparatuses detect an image of a fingerprint on the basis of a change in an electric characteristic based on a pressure or a change in an optical characteristic. The fingerprint authentication apparatuses and the like read out a physical quantity distribution converted into an electric signal by unit components (pixels in the solid-state imaging device) as the electric signal.

Among the solid-state imaging devices, there is amplification-type solid-state imaging device. The amplification-type solid-state imaging device includes pixels of an amplification-type solid-state imaging device (Active Pixel Sensor (APS); also referred to as gain cell or intra-pixel amplifier) constitution having a driving transistor for amplification in a pixel signal generator that generates a pixel signal corresponding to a signal charge generated by a charge generator. For example, many CMOS solid-state imaging devices adopt such a constitution (see, for example, Kazuya Yonemoto, "Basics and Applications of CCD/CMOS Image Sensor", CQ Publishing Co., Ltd., Aug. 10, 2003, First edition, Chapters 6 and 7 (Non-Patent Document 1).

In such an amplification-type solid-state imaging device, in order to read out a pixel signal to the outside, address control is applied to an imaging area in which plural unit pixels are arranged and signals from the respective unit pixels are selected and read out in a determined order of addresses or arbitrarily. In other words, the amplification-type solid-state imaging device is an example of an address control type solid-state imaging device.

In the address control type solid-state imaging device, MOS transistors are used in, for example, a switching element that selects pixels and a switching element that reads out signal charges. The MOS transistors are also used in a horizontal scanning circuit and a vertical scanning circuit. The address control type solid-state imaging device has an advantage that it is possible to manufacture the switching elements and the imaging area in series.

For example, in the MOS solid-state imaging device, respective unit pixels have MOS transistors. The MOS solid-state imaging device reads out signal charges accumulated in pixels by photoelectric conversion to a pixel signal generator, converts the signal charges into current signals or voltage signals, and outputs the current signals or the voltage signals.

For example, in an amplification-type solid-state imaging device that is a type of an X-Y address-type solid-state imaging device in which unit pixels are arranged in a matrix shape, pixels are constituted using active devices (MOS transistors) of a MOS structure or the like in order to give an amplification function to the pixels. In other words, signal charges (photoelectrons and holes) accumulated in photodiode serving as a photoelectric conversion element are amplified by the active device of a pixel signal generator and read out as image information.

In the X-Y address-type solid-state imaging device, for example, the imaging area includes a large number of pixel transistors arranged in a two-dimensional pixel shape. Accumulation of signal charges corresponding to incident light is started for each of lines (rows) or each of the pixels. Current signals or voltage signals based on the signal charges accumulated are read out in order from the respective pixels according to address designation. In the MOS (including CMOS) solid-state imaging device, a system for simultaneously accessing the pixels in one line and reading out pixel signals from the imaging area by a unit of row (hereinafter also referred to as row unit readout system or column readout system) is often used as an example of address control.

FIG. 14 is a schematic diagram of a solid-state imaging device 1 of the column readout system. The solid-state imaging device 1 includes a driving control unit 7 that has a horizontal scanning unit 12 and a vertical scanning unit 14 around an imaging area 10 of a pixel array structure in which plural unit pixels 3 are arranged in rows and columns. The driving control unit 7 includes, other than the horizontal scanning unit 12 and the vertical scanning unit 14, a timing control unit 11 of a Phase Lock Loop (PLL) constitution that receives a master clock CLK0 from the outside, generates various internal clocks, and controls the horizontal scanning unit 12, the vertical scanning unit 14, and the like. The driving control unit 7 also includes a column processor 20 serving as a signal processor that processes pixel signals outputted from the imaging area 10, a horizontal selection switch unit 60 that has selection switches (SW) 60a, a horizontal signal line 86, and an output unit 88.

In the imaging area 10, as an example, 1280 unit pixels 3 are arranged in a horizontal direction (H) and 960 unit pixels 3 are arranged in a vertical direction (V). The respective unit pixels 3 are connected to row control lines 15 controlled by the vertical scanning unit 14 and vertical signal lines 18 that transmit pixel signals to the column processor 20.

The column processor 20 includes column signal processors 22 including noise removing units 22a that have not-shown accumulation capacitors and use Correlated Double Sampling (CDS) processing and units (sample and hold (S/H) units) 22b that subject a signal to sample and hold (S/H).

With such a constitution, in one H period (e.g., 63.3 μs) for processing one row, a period for reading out a pixel signal from the imaging area 10 is about 8.5 μs and a period for horizontal transfer by the horizontal selection switch unit 60 is the remaining period of about 54.8 μs.

An analog pixel signal read out from the imaging area is converted into digital data by an Analog Digital Converter (an AD converter) when necessary. In the constitution in FIG. 14, as an example, the AD converter (ADC) is built in the output unit 88.

In general, the pixel signal is outputted in a form in which a signal component is added to a reset component. Thus, it is necessary to extract a true effective signal component by calculating a difference between a signal voltage corresponding to the reset component and a signal voltage corresponding to the signal component.

The same applies when an analog pixel signal is converted into digital data. Finally, it is necessary to convert a differential signal component of a signal voltage corresponding to a reset component and a signal voltage corresponding to a signal component into digital data. Therefore, various mechanisms for AD conversion have been proposed (see, for example, Non-Patent Document 1; W. Yang et. al., "An Integrated 800×600 CMOS Image System", ISSCC Digest of Technical Papers, pp. 304-305, February 1999 (Non-Patent Document 2); Toshifumi Imamura, Yoshiko Yamamoto, "3. Study of High-speed/function CMOS Image Sensor", [online], [retrieved Mar. 15, 2004], Internet URL:http://www.sankaken.gr.jp/project/iwataPJ/report/h12/h12index.html (Non-Patent Document 3); Toshifumi Imamura, Yoshiko Yamamoto, Naoya Hasegawa, "3. Study of High-speed/function CMOS Image Sensor", [online], [retrieved Mar. 15, 2004], Internet URL:http://www.sankaken.gr.jp/project/iwataPJ/report/h14/h14index.html (Non-Patent Document 4); and Oh-Bong Kwon et. al., "A Novel Double Slope Analog-to-Digital Converter for a High-Quality 640×480 CMOS Imaging System", VL3-03 1999 IEEE p 335 to 338) (Non-Patent Document 5).

For example, the Non-Patent Documents 1 to 5 disclose a mechanism for sequentially reading out signal outputs of pixels arranged in a matrix shape to vertical data lines for each row and, then, converting the signal outputs into digital data with an AD converter provided for each of the vertical data lines. Such an AD system will be hereinafter also referred to as a column ADC system.

In the mechanism for AD conversion (the column ADC system) disclosed in the Non-Patent Documents 1 to 5, to explain more in detail, a pixel signal from an imaging area and a voltage of a ramp waveform (a reference signal RAMP), a voltage value of which changes at a fixed inclination, are compared and time for the comparison processing is counted by a counter clock. Specifically, the count is started substantially simultaneously with start of the comparison and a value (digital data) of a counter representing a voltage of the ramp waveform at the time when an output of a comparator reverses is outputted, whereby pixel signals of respective vertical columns are converted into digital pixel data for each of the vertical columns.

FIG. 15 is a schematic diagram of a solid-state imaging device 1 of the column ADC system. The solid-state imaging device 1 includes a driving control unit 7 provided outside an imaging area 10, a column processor 20 that has a count processor (CNT) 23 and column AD circuits 24 arranged for each of vertical columns, a reference signal generator 26 including a Digital Analog Converter (DAC) that supplies a reference voltage for AD conversion to the column AD circuits 24 of the column processor 20, and an output unit 88 that has a function as a sense amplifier using digital signal processing.

The column AD circuits 24 include voltage comparators 242 that compare a reference voltage RAMP generated by the reference signal generator 26 and analog pixel signals obtained from unit pixels 3 through vertical data lines 18 (H1, H2, . . . ) for each of row control lines 15 (V1, V2, . . . ) and data storing units 244 including two sets of n latches (flip-flops) serving as memory devices that hold, for each bit data, a result obtained by counting time until the voltage comparators 242 complete the comparison processing using a count processor 23. The column AD circuit 24 has an n-bit AD conversion function. Since the column AD circuit 24 has the two sets of n latches, it is possible to hold data corresponding to a reset component and data corresponding to a signal component separately from each other.

A step-wise reference voltage RAMP generated by the reference signal generator 26 is commonly inputted to one input terminal of one of the voltage comparators 242 and one input terminals of the other voltage comparators 242. The vertical data lines 18 of vertical columns corresponding to the voltage comparators 242, respectively, are connected to the other input terminals of the voltage comparators 242. Pixel signal voltages from the imaging area 10 are separately inputted to the voltage comparators 242. Output signals of the voltage comparators 242 are supplied to data storing units 244.

The count processor 23 performs count processing on the basis of a counter clock CK0 corresponding to a master clock CLK0 (e.g., clock frequencies of both the clocks are equal) and supplies count outputs CK1, CK2, . . . , CKn commonly to the respective column AD circuits 24 of the column processor 20 together with the counter clock CK0 for synchronization.

In other words, wirings for the respective count outputs CK1, CK2, . . . , CKn from the count processor 23 are led to the respective latches of the data storing units 244 arranged for each of the vertical columns. Consequently, the column AD circuits 24 of the respective vertical columns commonly use the one count processor 23.

Output sides of the respective column AD circuits 24 are connected to a horizontal data line 86. The horizontal data line 86 has data lines for a 2n-bit width. Data are supplied to 2n sense amplifiers corresponding to not-shown respective output lines in the output unit 88. A not-shown subtraction circuit is provided in the output unit 88. The output unit 88 extracts true effective signal data by calculating a difference between data corresponding to a reset component and data corresponding to a signal component.

According to such a column ADC system, since AD conversion is performed in the respective columns (vertical columns), the column ADC system is advantageous for an increase in speed of readout and the AD conversion processing.

SUMMARY OF THE INVENTION

However, as described above, the physical quantity distribution detection semiconductor device in the past reads out signal charges accumulated in pixels by photoelectric conversion to the pixel signal generator, converts the signal charges into current signals or voltage signals, and outputs the current signals or the voltage signals.

This means that voltage amplitudes or current amplitudes are set to a high level or a low level according to a quantity of signal charges and a quantity of unit signals is allocated according to a difference of the levels to transmit information. Therefore, output signals are susceptible to influences of a substrate bias effect and a wiring length and are poor in a noise resistance property (a first problem).

In the AD conversion, since the AD conversion is performed after converting signal charges into current signals or voltage signals, the influences of the substrate bias effect and the wiring length appear in a result of the AD conversion. Thus, the first problem also occurs.

Further, in the column ADC system, the following problems occur when it is attempted to apply the column ADC system to a large scale (20 million pixels) and high-speed (500 fps) CMOS image sensor.

For example, when a length of a ramp data line is increased, a resistance, a wiring capacity, and a total capacity of gates connected increase. Values of the resistance, the wiring capacity, and the total capacity of the gates vary depending on a position in a CMOS image sensor chip. The values are affected more as the ramp data line is longer. As a result, a voltage (a reference signal RAMP) of the ramp data line varies depending on a position in the CMOS image sensor chip. Thus, it is difficult to accurately correct color sensitivities of the respective pixels and the color sensitivities appear as shading of an image (a second problem).

This problem is more conspicuous when it is attempted to actuate a CMOS image sensor having a large chip size and high conversion rate. In other words, when a chip size of a sensor increases and a high conversion rate may be required, it is difficult to accurately and rapidly transmit a reference signal for AD conversion processing to all comparators. This makes it difficult to perform accurate sensitivity correction (in the case of a color image, color sensitivity correction).

When the number of pixels is increased, a processing period may be required in the AD conversion that uses a reference signal. The constitution of the column ADC system in the past shown in FIG. 15 has a difficulty in high-speed AD conversion. To reduce the AD conversion processing time, it is conceivable to increase a frequency of the counter clock CK0. However, it is necessary to wire the counter clock CK0 for synchronization and the respective count outputs CK1, CK2, . . . , CKn from the count processor 23 to the respective latches of the data storing units 244 arranged for each of the vertical columns. Noise and power consumption are increased by the wiring (a third problem).

It is desirable to provide a new mechanism that can solve at least one of the first to the third problems.

A physical information acquiring method according to an embodiment of the invention is a physical information acquiring method of acquiring physical information for a predetermined purpose on the basis of change information that is acquired under predetermined detection conditions for a physical quantity using a portion for physical quantity distribution detection. The portion for physical quantity distribution detection includes a detector that detects change information corresponding to a change in a physical quantity made incident on the detector and has unit components that output unit signals based on the change information detected by the detector arranged in a predetermined order. In the physical information acquiring method, a carrier signal is converted into a signal related to a frequency on the basis of the change information detected by the detector. The physical information for a predetermined purpose is acquired using the signal related to a frequency.

A physical information acquiring device according to another embodiment of the invention is an apparatus suitable for implementing the physical information acquiring method. The physical information acquiring device includes a signal converter that converts a carrier signal into a signal related to a frequency on the basis of change information detected by a detector. The physical information acquiring device acquires physical information for a predetermined purpose using the signal related to a frequency generated by the signal converter.

A physical quantity distribution detector according to still another embodiment of the invention is a device that is used for implementing the physical information acquiring method and the physical information acquiring device. The physical quantity distribution detector includes, on a detection area in which unit components are arranged in a predetermined order, a signal converter that converts a carrier signal into a signal related to a frequency on the basis of change information detected by a detector and an AD conversion processor that converts, with the change information detected by the detector set as a processing object signal, the processing object signal into digital data using the signal related to a frequency generated by the signal converter.

In other embodiments of the invention, further advantageous specific examples of the physical information acquiring method, the physical information acquiring device, and the physical quantity distribution detector are provided.

For example, it is also possible to further include an AD conversion processor that converts, with change information detected by the detector set as a processing object signal, the processing object signal into digital data using a signal related to a frequency generated by the signal converter.

The signal converter and the AD conversion processor may be provided outside the detection area in which the unit components are arranged in a predetermined order. However, it is also possible to provide the signal converter and the AD conversion processor on the detection area. In the latter case, it is desired that areas occupied by the signal converter and the AD conversion processor do not affect detection processing for physical information in the detector.

In this case, when only the signal converter is provided on the detection area, as means for reducing the number of signal converters and the number of AD conversion processors, it is advisable to provide a selection switching unit that allocates one signal converter to plural unit components or allocates one output terminal to plural signal converters.

When both the signal converter and the AD conversion processor are provided on the detection area, it is advisable to provide a selecting switching unit that allocates one output terminal to plural signal converters and/or AD conversion processors. It goes without saying that the selection switching unit is also provided on the detection area.

When the signal converter, the AD conversion processor, and the selection switching unit are provided on the detection area, it is preferable that the physical quantity distribution detector is a back-illuminated type detector. The back-illuminated type means that a detector has a semiconductor element layer in which the signal converter, the AD conversion processor, and the selection switching unit are formed on one surface side of an element layer in which the detector is formed and a physical quantity is made incident on the detector from the other surface side of the element layer.

It is not essential that all of the signal converter, the AD conversion processor, and the selection switching unit are provided in an identical semiconductor element layer. At least the signal converter, the AD conversion processor, and the selection switching unit only have to be formed in an arbitrary number of semiconductor element layers on the opposite side of the other surface side. For example, the signal converter, the AD conversion processor, and the selection switching unit may be provided in different semiconductor element layers, respectively.

The signal converter only has to have a function of converting a carrier signal into a modulated signal related to a frequency on the basis of change information detected by the detector. A frequency modulator that modulates a frequency component itself of a carrier signal according to change information serving as a modulated signal may be provided or a phase modulator that modulates a phase component of a carrier signal according to change information serving as a modulated signal may be provided.

It is advisable that the AD conversion processor converts a processing object signal, which is change information detected by the detector, into digital data by subjecting a width of a predetermined count object pulse to pulse count processing according to a signal outputted from the signal converter. In this case, it is advisable to adopt, in order to reduce the problems such as noise and power consumption due to wiring for counter clock and wiring for a gate signal to be measured, a mechanism for lowering frequencies thereof.

For example, when the frequency modulator is provided as the signal converter, a pulse width of a reference signal only has to be counted according to an output signal of the frequency modulator. It is possible to lower a frequency of a reference signal serving as a gate signal used for count processing for AD conversion by pulse-counting a width of a pulse of the reference signal using a signal outputted from the signal converter as a counter clock. Alternatively, it is also possible to divide an output signal of the frequency modulator and use the output signal as a gate signal to lower a frequency of the gate signal and count a pulse width thereof according a reference signal.

When the phase converter is provided as the signal converter, it is sufficient to provide a phase discriminator that extracts phase information on the basis of a reference signal of a predetermined frequency and a signal outputted from the phase modulator and count a width of a count object pulse representing the phase information outputted from the phase discriminator according to the reference signal of the predetermined frequency or the signal outputted from the phase modulator.

In this case, it is advisable to adopt a mechanism for lowering a frequency of a count object pulse representing phase information. This means that a frequency of a count object pulse serving as a gate signal used for count processing for AD conversion is lowered.

When a differential signal component of a reference component and a signal component of an analog processing object signal including the reference component and the signal component, as a constitution of the AD conversion processor, it is desirable to include a count processor that performs count processing in one of a down-count mode and an up-count mode and hold a count value at the time of completion of the processing. In this case, it is advisable to switch the mode of the count processing according to whether the processing is applied to the reference component or the signal component.

As mode switching processing of the count processing, first, as first processing, the count processing in one of the down-count mode and the up-count mode is applied to a signal corresponding to one of a reference component and a signal component having different physical characteristics in one processing object signal outputted from an identical unit element such as a pixel. A count value at the time of completion of the processing is held.

As second processing, the count processing in the other of the down-count mode and the up-count mode is applied to the other of the reference component and the signal component. A count value at the time when this comparison processing is completed is held.

Consequently, a count value held after the second processing is a difference between the count value in the first processing and the count value in the second processing. In other words, a digital value corresponding to a difference between the reference component and the signal component is obtained as a count value of the second count processing by performing the count processing twice by switching the count mode.

The signal component subjected to the count processing in the second processing only has to indicate at least a true signal component in a processing object signal. The signal component does not mean only the true signal component and may actually include a noise component, a reset component, and the like included in the processing object signal.

The reference component and the signal component are relative components. The differential signal component of the reference component and the signal component only has to be a component of a difference between two signal components having different physical characteristics in one processing object signal outputted from an identical unit element such as a pixel.

In applying the count processing to the reference component and the signal component, it is advisable to obtain a count value corresponding respective magnitudes of the reference component and the signal component by pulse-counting a width of a predetermined count object pulse using a signal outputted from the signal converter as a counter clock. It is possible to lower a frequency of agate signal used for count processing for AD conversion.

In performing the count processing in the down-count mode and the up-count mode, it is advisable to switch the processing mode while using a common up-down counter. This makes it possible to reduce a size of a counter circuit used for the count processing. In addition, it is possible to directly perform subtraction processing for a reference component and a signal component by performing the count processing while switching the two modes. This makes a special subtracter for calculating a difference between the reference component and the signal component unnecessary.

It is advisable to start the count processing in the second processing from the count value held in the first processing. Consequently, a count value held after the second processing is a digital value of a difference itself between the reference component and the signal component.

If the count processing applied to the reference component as the first processing and the count processing is applied to the signal component as the second processing, a count value held after the second processing is a digital value obtained by subtracting a count value for the reference component from a count value for the signal component.

When the processing object signal of unit components such as pixels is a signal in which a signal component appears after a reference component in time series, the second processing is processing for a signal obtained by adding the signal component to the reference component. A count value held after the second processing represents a signal component of the unit components.

If the processing for the reference component is performed in the down-count mode and the processing for the signal component is performed in the up-count mode, as a count value held after the processing performed twice is obtained, a digital value obtained by subtracting a count value for the reference component from a count value for the signal component is obtained as a positive value.

As a combination of the two kinds of processing described above, if the down-count processing is performed for the reference component as the first processing and the up-count processing is performed for the signal component as the second processing, as a count value held after the second processing, a digital value obtained by subtracting a count value for the reference component from a count value for the signal component is obtained as a positive value. When the processing object signal of unit components is a signal in which the signal component appears after the reference component in time series, digital data representing an effective signal component of the unit components is conveniently obtained as a positive value.

It is advisable to hold, concerning a last processing object signal, a count value held in the second processing in another data storing unit and, when the first processing and the second processing are applied to a present processing object signal, perform readout processing for the count value from the data storing unit in parallel with the first processing and the second processing. In short, an overall processing time is reduced by performing the AD conversion processing using the count processing and the readout processing for reading out an AD conversion result to the outside as pipeline processing. When a pipeline operation for performing the AD conversion processing and the readout processing in parallel is performed, memory devices that hold data subjected to the AD conversion only have to be provided for one system for each AD converter. It is possible to hold down an increase in a circuit area as much as possible.

It is possible to use the AD conversion processing, in a semiconductor device for physical quantity distribution detection including, in unit components, a charge generator that generates charges corresponding to an electronic magnetic wave made incident on the detector and a unit signal generator that generates a unit signal corresponding to the charges generated by the charge generator and having the unit components arranged in a matrix shape, for processing for converting an analog unit signal generated by the unit signal generator and outputted in a column direction into digital data as a processing object signal.

When the unit components are arranged in a two-dimensional matrix shape in this way, it is advisable to realize an increase in speed of readout of a unit signal and the AD conversion processing by performing (vertical) scan reading for accessing and capturing, by a unit of row (in parallel for columns), an analog signal generated by the unit signal generator and outputted in a column direction and performing the first processing and the second processing for the respective unit components by the unit of row.

When the unit components are arranged in the two-dimensional matrix shape, if the signal converter and the AD conversion processor are provided outside the detection area, it is advisable to provide plural signal converters and plural AD conversion processors in a row direction that is an arrangement direction of columns of the unit components.

It is advisable that the signal converter captures, by a unit of row, an analog unit signal generated by the unit signal generator and outputted in the column direction and the AD conversion processor applies, processing carried out by the respective AD conversion processor, to the respective unit components by the unit of row. It is advisable that the unit signal generator has a semiconductor element for amplification.

If the charge generator has a photoelectric conversion element that receives light irradiated as an electromagnetic wave and generates a charge corresponding to the light received, it is possible to constitute a semiconductor device as a solid-state imaging device.

DESCRIPTION OF THE PRESENTLY PREFERRED EMBODIMENTS

Embodiments of the invention will be hereinafter explained in detail with reference to the accompanying drawings. In an example explained below, a CMOS imaging device that is an example of a solid-state imaging device of an X-Y address type is used as a device.

However, this is only an example and a device to which embodiments of the invention described below are applied is not limited to a MOS imaging device. It is possible to apply the embodiments to all semiconductor devices for physical quantity distribution detection that have plural unit components, which have sensitivity to light and electromagnetic waves inputted from the outside such radiations, arranged therein in a line shape or a matrix shape.

Schematic Constitution of an Imaging Apparatus; First Embodiment

Figure 1A:
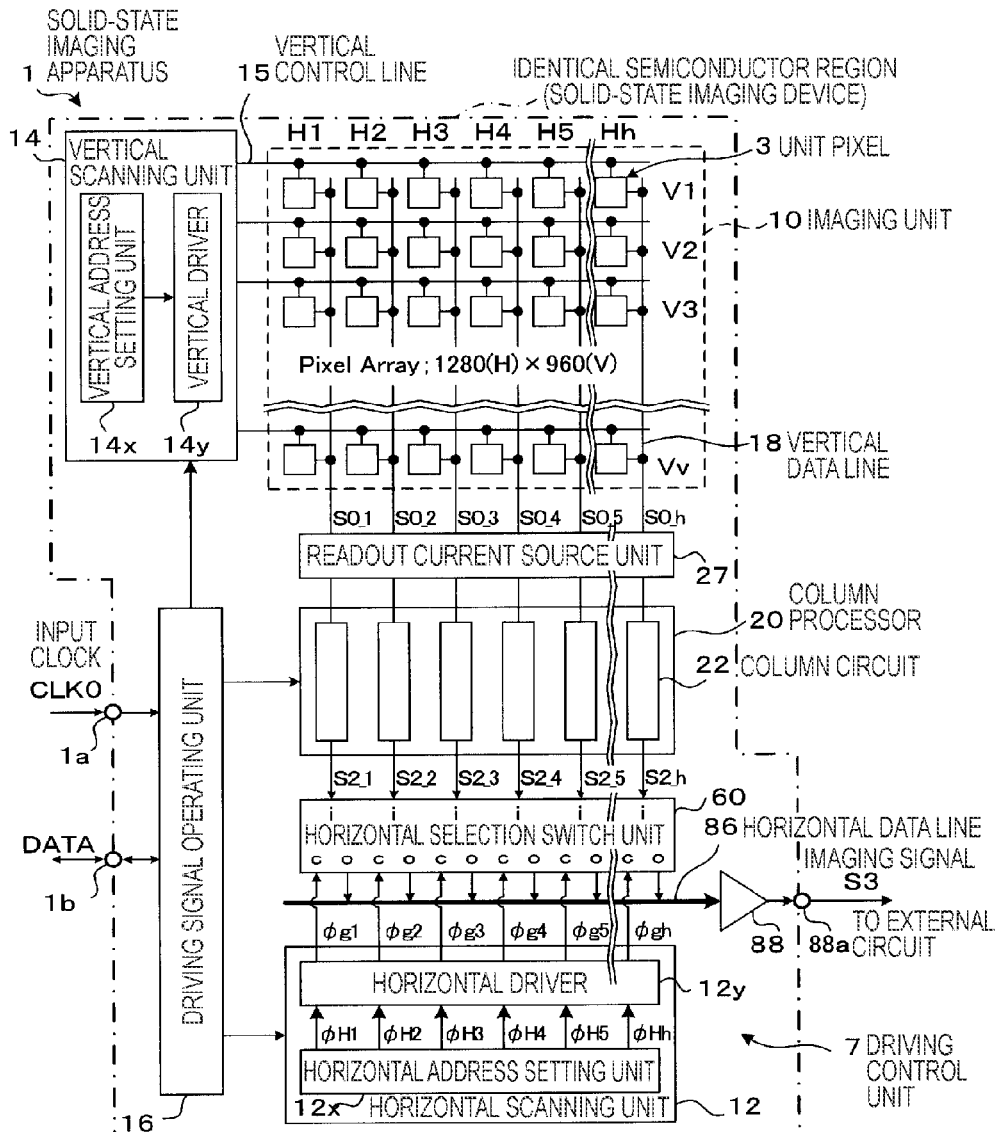
FIGS. 1A and 1B are schematic diagram of a CMOS solid-state imaging device that is a form of a physical information acquiring device according to a first embodiment of the invention.
Figure 1B:
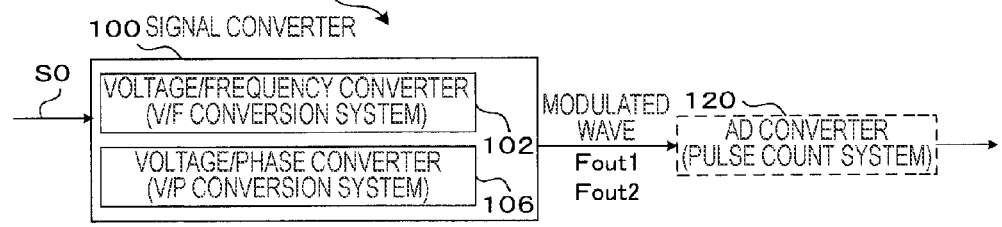

FIGS. 1A and 1B are schematic diagrams of a CMOS solid-state imaging device that is a form of a physical information acquiring device according to a first embodiment of the invention. A solid-state imaging device 1 in this embodiment is used in a camera apparatus, for example, a camera module product, an electronic still camera or a Factory Automation (FA) camera that can pick up a color image. The solid-state imaging device 1 is an example of a physical quantity distribution detector.

The solid-state imaging device 1 has an imaging area in which unit pixels including a light-receiving element serving as a not-shown detector that outputs a signal corresponding to an incident light amount are arranged in a square lattice shape of rows and columns (i.e., a two-dimensional matrix shape). The solid-state imaging device 1 is a column type solid-state imaging device in which signal outputs from the respective unit pixels are voltage signals and a Correlated Double Sampling (CDS) processing functional unit and other functional units are provided for each of vertical columns.

The constitution of the first embodiment has a characteristic in that a "functional unit that converts a carrier signal into a signal related to a frequency on the basis of a signal charge reflecting a light amount", which is a characteristic part of the embodiments of the invention, is provided in a column processor 20. The solid-state imaging device 1 will be hereinafter specifically explained.

As shown in FIG. 1A, the solid-state imaging device 1 in the first embodiment includes an imaging area (a pixel unit) 10, that is, an area sensor unit, in which a large number of unit pixels 3 (an example of unit components) are arranged in rows and columns (in a two-dimensional shape), a driving control unit 7 provided outside the imaging area 10, a column processor 20 including column signal processors (in the figure, "column circuits") 22 arranged in respective vertical columns, and a horizontal selection switch unit 60. Although not shown in the figure, an external circuit is provided on a circuit board separate from a semiconductor region in which the imaging area 10 is provided.

A readout current source unit 27 is provided on signal paths (vertical data lines 18) between the imaging area 10 and the column processor 20. In the readout current source unit 27, a not-shown load transistor unit including load MOS transistors, drain terminals of which are connected to the respective vertical data lines 18 having both functions of a signal readout line and a readout current supply line, is arranged. A load control unit (a load MOS controller) that controls to drive the respective load MOS transistors is provided. In this case, current supply of the vertical data lines 18 is controlled to be on and off every time a readout row is switched for the purpose of, for example, reducing a current consumption amount and eliminating an influence of accumulated charges on a parasitic capacitance.

The driving control unit 7 includes, for example, a horizontal scanning unit 12 and a vertical scanning unit 14. As other components of the driving control unit 7, a driving signal operating unit (an example of a readout address control device) 16 is provided. The driving signal operating unit supplies control pulses of predetermined timing to the respective functional units of the solid-state imaging device 1 such as the horizontal scanning unit 12, the vertical scanning unit 14, and the column processor 20.

The respective components of the driving control unit 7 is formed on a semiconductor region such as a monocrystal silicon integrally with the imaging area 10 using a technology same as the semiconductor integrated circuit manufacturing technology. The components are constituted as a solid-state imaging device that is an example of a semiconductor system.

In FIG. 1A, a part of rows and columns are not shown for simplification of illustration. However, actually, several tens to several thousands unit pixels 3 are arranged in the respective rows and the respective columns of the imaging area 10. Although not shown in the figure, color separation filters and on-chip lenses having predetermined color coding are formed in the respective pixels. Further, although not shown in the figure, the respective unit pixels 3 of the imaging area 10 are constituted by photoelectric conversion elements such as photodiode or photogate and transistor circuits.

The unit pixels 3 are connected to the vertical scanning unit 14 and the column processor 20 via vertical control lines 15 for vertical column selection and the vertical data lines 18 serving as transmission lines, respectively. The vertical data lines 18 transmit pixel signals SO (S0_1 to S0_$h$; 1 to h are pixel numbers in one row) outputted from the unit pixels 3 after being detected by plural detectors and amplified by a unit signal generator having amplifying elements.

The horizontal scanning unit 12 and the vertical scanning unit 14 start a shift operation (scanning) in response to a driving pulse given from the driving signal operating unit 16. Various pulse signals for driving the unit pixels 3 are included in the vertical control lines 15.

The horizontal scanning unit 12 includes a horizontal address setting unit 12$x$ that defines a readout column in the horizontal direction (an address in the horizontal direction) (selects the respective column signal processors 22 in the column processor 20) and a horizontal driver 12$y$ that leads respective signals of the column processor 20 to a horizontal data line 86 in accordance with the readout address defined by the horizontal address setting unit 12$x$.

Although not shown in the figure, the horizontal address setting unit 12$x$ includes a shift register or a decoder. The horizontal address setting unit 12$x$ has a function as selecting means for selecting pixel information from the column signal processors 22 in a predetermined order and outputted the pixel information selected to the horizontal data line 86.

The vertical scanning unit 14 includes a vertical address setting unit 14$x$ that defines a readout row in the vertical direction (an address in the vertical direction) and a readout column in the horizontal direction (an address in the horizontal direction) (selects a row of the imaging area 10) and a vertical driver 14$y$ that supplies a pulse to the row control lines 15 for the unit pixels 3 on the readout address in the horizontal row direction defined by the vertical address setting unit 14$x$ and drives the unit pixels 3.

Although not shown in the figure, the vertical address setting unit 14x also includes a shutter shift register that performs control for rows for an electric shutter other than a vertical shift register or a decoder that performs basic control for rows for reading out signals.

The vertical shift register is a shift register for selecting the respective unit pixels 3 by a unit of row in reading out pixel information from the imaging area 10. The vertical shift register constitutes a signal output row selecting unit together with the vertical driver 14y for the respective rows. The shutter shift register is a shift register for selecting the respective pixels by a unit of row in performing an electronic shutter operation. The shutter shift register constitutes an electronic shutter row selecting unit together with the vertical driver 14y for the respective rows.

Although not shown in the figure, the driving signal operating unit 16 includes a functional block of a timing generator TG (an example of a readout address control device) that supplies clocks and pulse signals of predetermined timing necessary for operations of the respective units and a functional block of a communication interface that receives an input clock CLK0 and data instructing an operation mode or the like via a terminal 1a and outputs data DATA including information on the solid-state imaging device 1 via a terminal 1b. The driving signal operating unit 16 outputs a horizontal address signal to the horizontal address setting unit 12x and outputs a vertical address signal to the vertical address setting unit 14x. The address setting units 12x and 14x receive the address signals and select a row or a column corresponding to the address signals.

The driving signal operating unit 16 may be provided as a separate semiconductor integrated circuit independently from the other functional elements such as the imaging area 10 and the horizontal scanning unit 12. In this case, an imaging device, which is an example of a semiconductor system, is built by the imaging device including the imaging area 10 and the horizontal scanning unit 12 and the driving signal operating unit 16. This imaging device may be provided as an imaging module in which a signal processing circuit, a power supply circuit, and the like in the periphery.

The column processor 20 includes the column signal processors 22 for the respective vertical columns. In response to signals of pixels in one row, the respective column signal processors 22 process image signals S0 (S0_1 to S0_h; 1 to h are pixel numbers in one row) of corresponding columns and output processed pixel signals S1 (S1_1 to S1_h; 1 to h are pixel numbers in one row).

For example, although not shown in the figure, the column signal processors 22 include storing units including storage capacitors. The column signal processors 22 may have a signal holding function of a line memory structure for storing potential signals Vm representing physical information for a predetermined purpose based on the pixel signals (unit signals) SO read out from the unit pixels 3 via the vertical data lines 18. Further, the column signal processors 22 may have a functional unit of noise removing units that also have storage capacitors and use Correlated Double Sampling (CDS) processing.

In performing the CDS processing, the column signal processors 22 remove noise signal components called Fixed Pattern Noise (FPN) and reset noise due to fixed variation of the respective pixels by applying processing for calculating a difference between a signal level (a noise level; 0 level) immediately after pixel reset and a true signal level to pixel information of a voltage mode inputted via the vertical data lines 18 on the basis of two sample pulses, namely, a sample pulse SHP and a sample pulse SHD, given from the driving signal operating unit 16.

It is also possible to provide an Auto Gain Control (AGC) circuit having a signal amplification function, other processing function circuits, and the like when necessary at a post stage of a CDS processing function unit or the like.

As described in detail later, as a constitution peculiar to this embodiment, as shown in FIG. 1B, the column signal processor 22 includes a signal converter 100 as a functional unit that converts a carrier signal into a signal related to a frequency on the basis of a signal charge reflecting a light amount. It is also possible to provide, at a post stage of the signal converter 100, an AD converter 120 of a pulse count system that realizes AD conversion by performing digital count processing on the basis of a modulated carrier signal (a modulated signal).

The signal converter 100 only has to have a function for converting a carrier signal into signal related to a frequency on the basis of a pixel signal of a voltage mode acquired by the imaging area 10. Further, the signal converter 100 only has to include a voltage/frequency converter (V/F) 102 serving as a frequency modulator that modulates a frequency f itself of the carrier signal according to a pixel signal used as a modulated signal or a voltage/phase converter (V/P) 106 serving as a phase modulator that modulates a phase φ according to a pixel signal used as a modulated signal.

The AD converter 120 provided at the post stage of the signal converter 100 only has to be a unit that performs digital count processing on the basis of a carrier signal (a modulated signal) modulated by the signal converter 100. It is possible to adopt both a constitution for subjecting a pulse width or a phase fluctuation width of the modulated signal to count processing according to a reference signal and a constitution for subjecting a pulse width of the reference signal or a phase fluctuation width of the reference signal to count processing according to the modulated signal, that is, counting the number of pulses per a set time according to the modulated signal.

A pixel signal outputted from the imaging area 10 is represented by a reference level such as a reset level and a true signal level superimposed on the reset level. Thus, in order to extract the true signal level, the pixel signal is subjected to differential processing between the reset level and the signal level. In this case, in the relation of the signal converter 100 and the AD converter 120, it is possible to realize the differential processing by calculating a difference of the respective numbers of pulses in the reset level and the signal level. Moreover, it is possible eliminate individual variation of the signal converter 100 such as frequency offset and phase offset of a voltage control oscillator according to this differential processing.

The horizontal selection switch unit 60 including not-shown switches (selection switches) for horizontal readout is provided at a post stage of the column processor 20. Output terminals of the column signal processors 22 of the respective vertical columns are connected to input terminals i of the selection switches of the horizontal selection switch unit 60, which correspond to the respective vertical columns, for sequentially reading out pixels signals S2 from the column signal processors 22.

Control gate terminals c of the respective vertical columns of the horizontal selection switch unit 60 are connected to the horizontal driver 12y of the horizontal scanning unit 12 that controls and drives a readout address in the horizontal direction. On the other hand, output terminals o of the selection switches of the respective vertical columns of the horizontal selection switch unit 60 are commonly connected to the horizontal data line 86 that sequentially transfers and outputs pixel signals in the row direction. An output unit 88 is provided at a rear end of the horizontal data line 86.

The horizontal data line 86 functions as a readout line for outputting the respective pixel signals S0 (precisely, the pixel signals S2 based on the pixel signals S0), which are transmitted from the respective unit pixels 3 via the vertical data lines 18, in a predetermined order in the horizontal direction that is the arrangement direction of the vertical data lines 18. The horizontal data line 86 extracts signals selected by the not-shown selection switches provided for the respective vertical columns from the column signal processors 22 and passes the signals to the output unit 88.

Voltage signals of the respective vertical columns corresponding to signal charges representing pixel information processed by the column signal processors 22 are selected at predetermined timing and read out to the horizontal data line 86 by the selection switches provided for the respective vertical columns that are driven by horizontal readout pulses $\phi g1$ to $\phi gh$ corresponding to horizontal selection signals $\phi H1$ to $\phi Hh$ from the horizontal scanning unit 12. Then, the voltage signals are inputted to the output unit 88 provided at the rear end of the horizontal data line 86.

The output unit 88 amplifies, with an appropriate gain, the pixel signals $S2\_1$ to $S2\_h$ (h=n) of the respective unit pixels 3 outputted from the imaging area 10 through the horizontal data line 86 and, then, supplies the pixel signals to an external circuit via an output terminal 88a as an imaging signal S3. The output unit 88 performs, for example, only buffering in some cases and performs black level adjustment, column fluctuation correction, color relation processing, and the like before the buffering in other cases. When the AD conversion functional units is provided in the column signal processor 22, the output unit 88 may have a parallel/serial conversion function and may convert n-bit parallel digital data acquired by the column signal processors 22 into serial data and output the serial data.

In the solid-state imaging device 1 of the column type in this embodiment, output signals (voltage signals) from the unit pixels 3 are transmitted to the vertical data lines 18, the column processor 20 (the column signal processors 22), the horizontal data line 86, and the output unit 88 in this order. For the driving of the solid-state imaging device 1, pixel output signals for one row are transmitted to the column processor 20 in parallel via the vertical data lines 18 and signals after processing are outputted serially via the horizontal data line 86. A transfer operation for the pixel signals up to the column processor 20 is performed simultaneously for the unit pixels 3 in one row.

As long as driving for each of the vertical columns or each of the horizontal rows is possible, it may be optionally decided whether pulse signals for driving the unit pixels should be supplied from the horizontal row direction or the vertical column direction to the unit pixels 3. In other words, a physical wiring method for driving clock lines for applying pulse signals is optional.

In the solid-state imaging device 1 of such a constitution, a CMOS image sensor of a type for selecting the respective pixels of the imaging area 10 in order by a unit of horizontal row and simultaneously reading out information on the pixels for one horizontal row selected is constituted by the horizontal scanning unit 12, the vertical scanning unit 14, and the driving signal operating unit 16 that controls the horizontal scanning unit 12 and the vertical scanning unit 14.

An external circuit provided at a post stage of the output unit 88 is formed on a substrate (a printed board or a semiconductor substrate) separate from the substrate of the solid-state imaging device on which the imaging area 10, the driving control unit 7, and the like are integrally formed in an identical semiconductor region. A circuit constitution corresponding to each photographing mode is adopted.

The solid-state imaging device 1 is constituted by the solid-state imaging device (an example of the semiconductor device and the physical information acquiring device according to the embodiments of the invention) including the imaging area 10 and the driving control unit 7 and the external circuit. It is also possible that the driving control unit 7 is separately provided from the imaging area 10 and the column processor 20, a solid-state imaging device (an example of the semiconductor device) is constituted by the imaging area 10 and the column processor 20, and an imaging apparatus (an example of the physical information acquiring device) is constituted by this solid state imaging device and the separate driving control unit 7.

Although not shown in the figure, the external circuit includes, for example, an Analog to Digital (A/D) converter that converts an analog imaging signal S3 outputted from the output unit 88 into digital imaging data D3 and a Digital Signal Processor (DSP) that performs digital signal processing on the basis of the imaging data digitized by the A/D converter. When the column signal processor 22 has an AD conversion function, the external circuit does not need to have the A/D converter.

The digital signal processor has a function of a digital amplifier unit that appropriately amplifies a digital signal outputted from the A/D converter and outputs the digital signal. The digital signal processor applies, for example, color separation processing to the digital signal to generate image data RGB representing respective images of red (R), green (G), and blue (B) and applies other signal processing to the image data RGB to generate image data for monitor output. The digital signal processor includes a functional unit that performs signal compression processing or the like for storing imaging data in a recording medium.

The external circuit also includes a Digital to Analog (D/A) converter that converts image data subjected to digital processing by the digital signal processor into an analog image signal. An image signal outputted from the D/A converter is transmitted to a not-shown display device such as a liquid crystal monitor. An operator is capable of performing various kinds of operation such as switching of an imaging mode while looking at a menu and an image displayed on the display device.

In an example explained in this section, the external circuit carrying out signal processing at the post stage of the solid-state imaging device is provided outside the solid-state imaging device (an imaging chip). However, all or a part of functional elements (e.g., the A/D converter or the digital amplifier unit) may be built in the chip of the solid-state imaging device. In other words, the external circuit may be formed on a semiconductor substrate identical with the semiconductor substrate on which the solid-state imaging device, in which the imaging area 10, the driving control unit 7, and the like are integrally formed in the identical semiconductor region, is formed. The solid-state imaging device 1 and the physical information acquiring device may be constituted as substantially identical apparatuses.

In the figure, the solid-state imaging device 1 includes the horizontal selection switch unit 60 and the driving control unit 7 together with the imaging area 10. The solid-state imaging device 1 is constituted to substantially function as the physical information acquiring device as well. However, the physical information acquiring device is not always limited to such a constitution. The entire horizontal selection switch unit 60 and the entire driving control unit 7 or a part of the functional units thereof are not required to be integrally formed in a semiconductor region identical with the semiconductor region in which the imaging area 10 is formed. The horizontal selection switch unit 60 and the driving control unit 7 may be formed on a circuit board (which means not only another semiconductor substrate but also a general circuit board) different from the circuit board on which the imaging area 10 is formed. For example, the horizontal selection switch unit 60 and the driving control unit 7 may be formed on the circuit board on which the external circuit is provided.

Details of the Signal Converter and the AD Converter

Figure 2A:
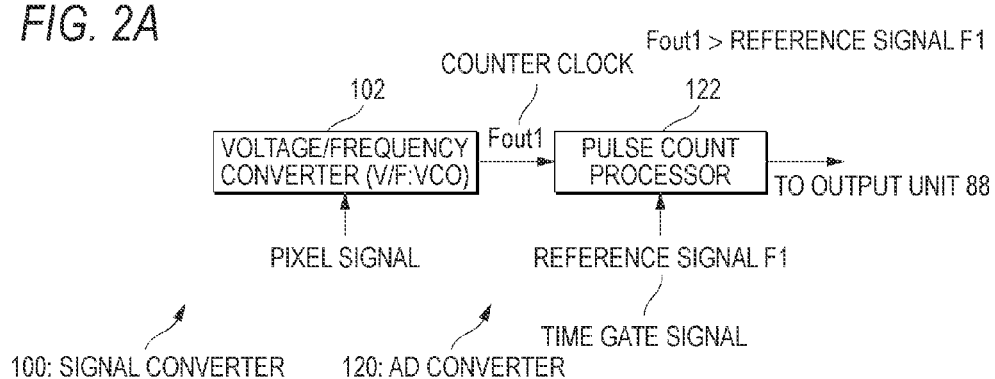
FIGS. 2A to 2C are diagrams for explaining a signal converter 100 and an AD converter 120 provided in a column signal processor 22.
Figure 2B:
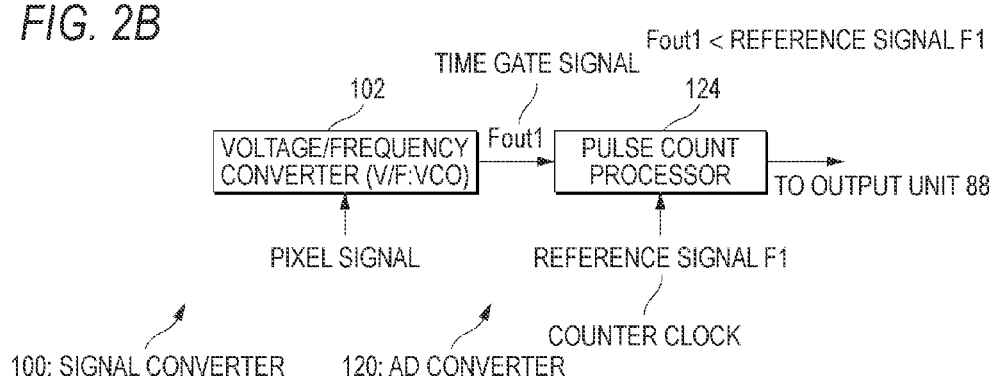
Figure 2C:
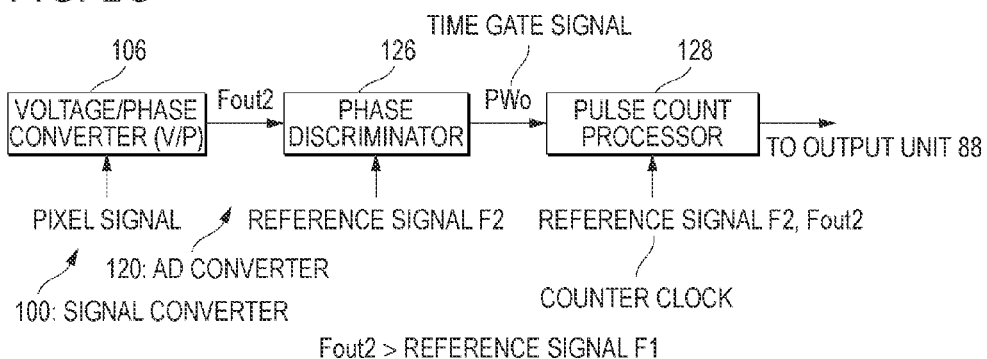

FIGS. 2A to 2C are diagrams for explaining the signal converter 100 and the AD converter 120 provided in the column signal processor 22. The signal converter 100 only has to have a function of converting a carrier signal into a modulated signal related to a frequency on the basis of a pixel signal. The signal converter 100 only has to modulate a frequency f itself or a phase φ of the carrier signal according to a pixel signal serving as a modulated signal.

For example, as shown in FIGS. 2A and 2B, it is possible to provide the signal converter 100 as a frequency modulator that uses a Frequency Modulation (FM) system, that is, a voltage/frequency conversion (V/F conversion) system. The Frequency Modulation (FM) system is a system for modulating the frequency f among parameters of the carrier signal according to the pixel signal, that is, associating an amplitude of the pixel signal with a frequency of the carrier signal and changing, with the amplitude fixed, the frequency according to an amplitude of the pixel signal serving as the modulated signal.

For example, the voltage/frequency converter 102 shifts, for example, a large signal level to a high/low frequency and shifts a small signal level to a low/high frequency to modulate a signal amplitude of the pixel signal such that the signal amplitude is equal to a frequency deviation of the carrier signal.

In principle, an FM modulated signal (a modulated signal Fout1) serving as a modulated signal is obtained by adding the pixel signal serving as the modulated signal to an oscillator that can control an oscillation frequency on the basis of a voltage, that is, a control voltage of a Voltage Controlled Oscillator (VCO).

A human being changes information obtained by the eyes into a pulse and transmits the information to the brain. If the frequency modulation system shown in FIGS. 2A and 2B is adopted, a mechanism for transmitting a frequency corresponding to a light amount is obtained. This is a form close to the mechanism of information transmission by the human eyes.

Alternatively, as shown in FIG. 2C, it is possible to provide the signal converter 100 as a frequency modulator that uses a Phase Modulation (PM) system, that is, a voltage/phase conversion (V/P conversion) system. The Phase Modulation (PM) system is a system for modulating the phase φ among parameters of the carrier signal according to the pixel signal, that is, associating an amplitude of the pixel signal with a phase of the carrier signal and changing, with the amplitude and a frequency fixed, the phase according to an amplitude of the pixel signal serving as the modulated signal.

For example, the voltage/phase converter 106 acquires a modulated signal Fout2 shifting, for example, a large signal level to a large/small phase fluctuation and shifting a small signal level to a small/large phase fluctuation to modulate a signal amplitude of the pixel signal such that the signal amplitude is equal to a phase deviation of the carrier signal.

This phase modulation system is a system for modulating the phase φ of the carrier signal and changing, with an amplitude fixed, a phase of a signal according to a modulated signal. It can be said that a difference between the phase modulation system and the frequency modulation system is whether the modulated signal is allocated to a frequency itself or a phase. The phase modulation system is similar to the frequency modulation system in terms of a waveform and in terms of a formula. It is possible to consider that the phase modulation system has the same characteristics as the frequency modulation system.

When the FM system or the PM system is used, even if an amplitude, a frequency, or a phase of the carrier signal (the modulated signal) fluctuates at the time of signal transmission, the fluctuation affects a signal carried by the modulated signal less, a deterioration amount of an SN ratio (a ratio of signal power to noise power) at the time when an input signal on a reception side weakens is small, and a noise resistance property is satisfactory.

The AD converter 120 provided at the post stage of the signal converter 100 performs digital count processing on the basis of a carrier signal (a modulated signal) modulated by the signal converter 100.

For example, when the AD converter 120 is provided at a post stage of the voltage/frequency modulator 102, as shown in FIG. 2A, it is possible to provide a pulse count processor 122 that applies count processing to a pulse width of a reference signal F1 of a relatively low frequency according to the modulated signal Fout1 outputted from the voltage/frequency converter 102. In the constitution shown in FIG. 2A, there is an advantage that it is possible to cause the reference signal F1 as a time gate signal and lower a frequency of the reference signal F1. Even when the reference signal F1 is wired to the AD conversion processor 120 arranged for each of the vertical columns, it is possible to reduce the problem of noise and power consumption due to the wiring by lowering a frequency of the reference signal F1.

Alternatively, as shown in FIG. 2B, it is possible to provide a pulse count processor 124 that applies count processing to a pulse width of the modulated signal Fout1 outputted from the voltage/frequency converter 102 according to the reference signal F1 of a relatively high frequency inputted from the outside. In the constitution shown in FIG. 2B, the modulated signal Fout1 functions as a time gate signal. Thus, if the modulated signal Fout1 is divided and, then, subjected to count processing according to the reference signal F1, there is an advantage that it is possible to lower a frequency of the reference signal F1 that functions as a counter clock. Even when the reference signal F1 is wired to the AD converter 120 arranged for each of the vertical columns as the counter clock, it is possible to reduce the problem of noise and power consumption due to the wiring by lowering a frequency of the reference signal F1.

When the AD converter 120 is provided at a post stage of the voltage/phase converter 106, as shown in FIG. 2C, first, a phase discriminator 126 that extracts phase information (performs phase discrimination) in digital processing on the basis of a reference signal F2 of a predetermined frequency and the modulated signal Fout2 outputted from the voltage/phase converter 106 serving as the phase modulator is provided. The phase discriminator 126 outputs a phase fluctuation width signal PWo representing a pixel signal by performing phase discrimination processing between the reference signal F2 inputted from the outside and the modulated signal Fout2 outputted from the voltage/phase converter 106.

Further, a pulse count processor 128 that subjects the phase fluctuation width signal PWo corresponding to the pixel signal detected by the phase discriminator 126 to count processing according to the modulated signal Fout2 or the reference signal F2 outputted from the voltage/phase converter 106 is provided.

Since the phase fluctuation width signal PWo functions as a time gate signal, if phase fluctuation (the phase fluctuation width signal PWo) is not only represented by maintaining a frequency of the modulated signal Fout2 but also represented by lowering a frequency of the reference signal F2, there is an advantage that it is possible to lower a frequency of a reference signal that functions as a counter clock. Even when the reference signal F2 is wired to the AD converter 120 arranged for each of the vertical columns as the counter clock, it is possible to reduce the problem of noise and power consumption due to the wiring by lowering a frequency of the reference signal F2.

Operations of a Solid-State Imaging Device; First Embodiment; First Example

Figure 3:
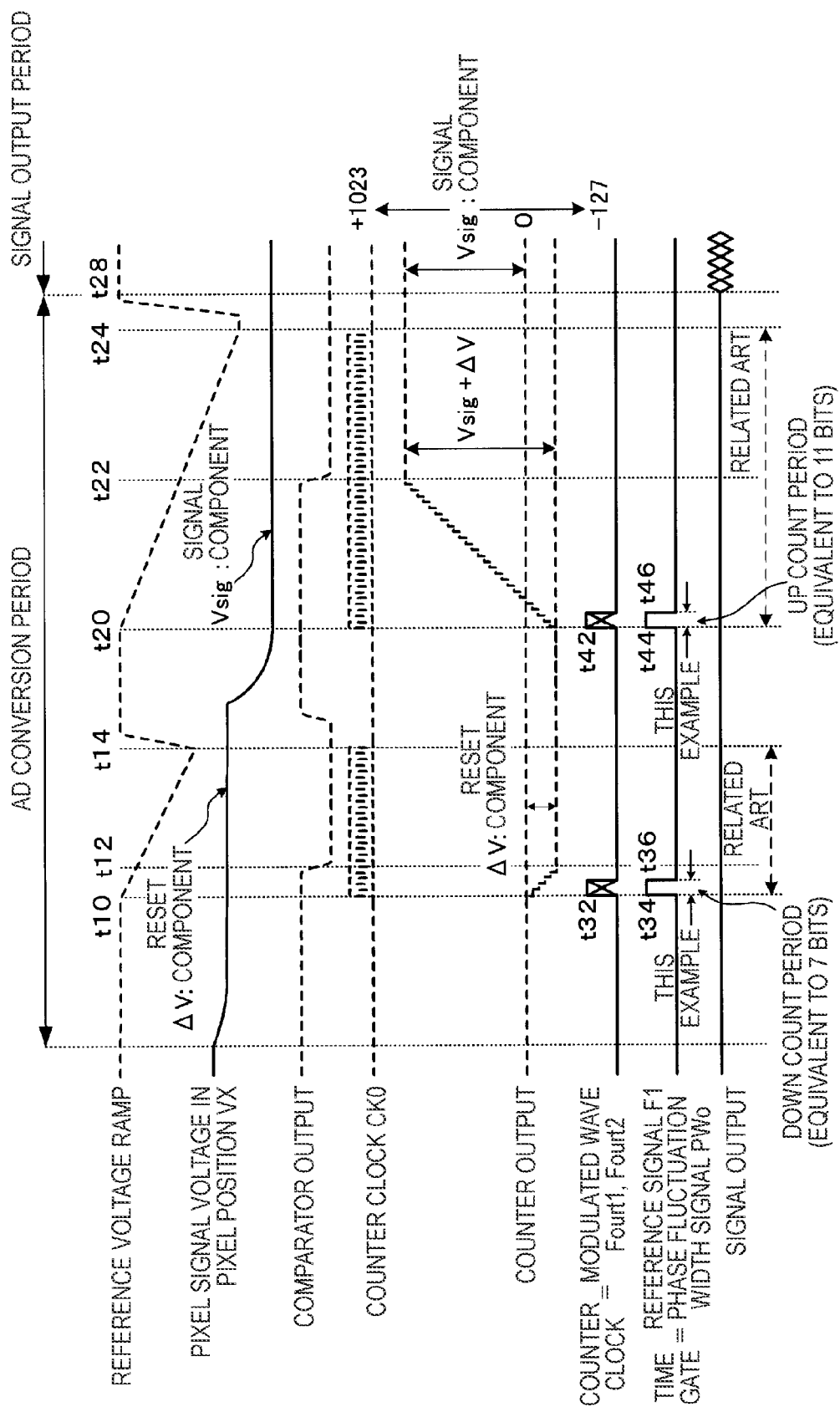
FIG. 3 is a timing chart for explaining operations in a column signal processor (in particular, a signal converter and an AD converter) of the solid-state imaging device in a first example of the first embodiment shown in FIG. 1A.

FIG. 3 is a timing chart for explaining operations in the column signal processor 22 (in particular, the signal converter 100 and the AD converter 120) of the solid-state imaging device 1 in a first example of the first embodiment shown in FIGS. 1A and 1B. As a comparative example, timing of the system in the past for performing AD conversion by comparing a ramp-like reference signal RAMP and a pixel signal voltage and counting time for the comparison according to a counter clock CLK0 is indicated by a dotted line.

In the first example, as shown in FIG. 2A, a pulse width of the reference signal F1 of a relatively low frequency inputted from the outside is subjected to count processing according to the modulated signal Fout1 outputted from the voltage/frequency converter 102. Alternatively, as shown in FIG. 2C, the phase fluctuation width signal PWo corresponding to the pixel signal detected by the phase discriminator 126 is subjected to count processing according to the reference signal F2 of a relatively high frequency or the modulated signal Fout2 inputted from the outside. In short, the number of pulses per set time or per phase fluctuation width signal PWo according to the modulated signal Fout1 or the modulated signal Fout2 (or the reference signal F1) is counted.

As a mechanism for converting an analog pixel signal detected by each of the unit pixels 3 of the imaging area 10 into a digital signal, as described above, a method of pulse-counting the modulated signal Fout1 corresponding to each voltage signal of a reference component or a signal component in the pixel signal from the unit pixel 3 according to the reference signal F1 is adopted. Alternatively, a method of pulse-counting the phase fluctuation width signal PWo, which is phase-discriminated on the basis of the modulated signal Fout2 corresponding to each voltage signal of a reference component or a signal component in the pixel signal from the unit pixel 3, according to the reference signal F1 to obtain a count value corresponding to each magnitude of the reference component or the signal component is adopted.

A pixel signal outputted from the vertical data line 18 is a pixel signal in which, in time series, a signal component Vsig appears after a reset component $\Delta V$ including noise of a pixel signal serving as a reference component. When count processing is applied to the reference component (the reset component $\Delta V$) as first processing, second count processing is processing for a signal obtained by adding the signal component Vsig to the reference component (the reset component $\Delta V$). The count processing will be hereinafter specifically explained.

For first readout (also referred to as P phase detection), first, the driving signal operating unit 16 resets a count value of the pulse count processor 122 or the pulse count processor 128 to an initial value "0" and sets the pulse count processor 122 or the pulse count processor 128 in a down-count mode. After the first readout from the unit pixels 3 in an arbitrary row Hx to the vertical data lines 18 (H1, H2, . . . ) is stabilized, the driving signal operating unit 16 instructs the voltage/frequency converter 102, the voltage/phase converter 106, and the phase discriminator 126 to start processing. This is for the purpose of eliminating an influence on the peripheral part by actuating these units only when the actuation may be required. The voltage/frequency converter 102, the voltage/phase converter 106, the phase discriminator 126 may be always started.

In response to the instruction, the voltage/frequency converter 102 outputs a frequency corresponding to a pixel signal voltage of an arbitrary vertical data line 18 (Vx) supplied from the imaging area 10 as the modulated signal Fout1 (t32). The voltage/phase converter 106 outputs the modulated signal Fout2 of a predetermined frequency having phase fluctuation corresponding to the pixel signal voltage of the arbitrary vertical data line 18 (Vx) supplied from the imaging area 10 (t32). The phase discriminator 126 performs phase discrimination on the basis of the modulated signal Fout2 and outputs the phase fluctuation width signal PWo indicating phase fluctuation corresponding to the pixel signal voltage of the vertical data line 18 (Vx) (t32).

In order to measure the number of pulses corresponding to pixel signals read out from the imaging area 10 in the first processing in the pulse count processor 122 or the pulse count processor 128 arranged in each row, at a point when an output of the modulated signal Fout1 or the phase fluctuation width signal PWo is stabilized, the driving signal operating unit 16 supplies the reference signal F1 or the reference signal F2 to the pulse count processor 122 or the pulse count processor 128. The driving signal operating unit 16 causes the pulse count processor 122 or the pulse count processor 128 to start down-count from the initial value "0" as a first count operation (t34).

In this case, the pulse count processor 122 or the pulse count processor 128 subjects one clock width (an active period; in this example, only an H level is enough) of the reference signal F1 or the phase fluctuation width signal PWo to count processing in a negative direction according to the modulated signal Fout1 or the reference signal F2 (or the modulated signal Fout2).

When the pulse count processor 122 or the pulse count processor 128 ends counting of the one clock width, the pulse count processor 122 or the pulse count processor 128 stops the count operation and latches (holds or stores) a count value at that point as pixel data to complete AD conversion (t36). In other words, at the time of first readout, the pulse count processor 122 or the pulse count processor 128 counts one clock of the modulated signal Fout1 or the phase modulation width signal PWo according to the reference signal F1 or the reference signal F2 to obtain a count value corresponding to a magnitude of a reset component Vrst.

At the time of this first readout, count processing is applied to the reset level Vrst in the pixel signal voltage Vx. Thus, the reset component $\Delta V$ of the unit pixel 3 is readout.

Noise varying for each of the unit pixels 3 is included in the reset component $\Delta V$ as offset. However, in general, variation of the reset component $\Delta V$ is small and the reset level Vrst is generally common to all the pixels. Thus, an output value of the reset component $\Delta V$ at the pixel signal voltage Vx of the arbitrary vertical data line 18 is known on the whole. Thus, it is possible to hold down bit resolution for the reset component $\Delta V$ to be lower than bit resolution for the signal component Vsig. For example, it is possible to set the bit resolution for the reset component ΔV to about 7 bits (up to −127) compared with the bit resolution for the signal components Vsig of 11 bits (up to +1023).

For this purpose, in the case of the signal form shown in the figure, since the reset component ΔV is larger than the signal component Vsig, it is advisable that the voltage/frequency converter 102 modulates a signal amplitude of the pixel signal by shifting a large signal level (the reset component ΔV) to a low frequency and shifting a small signal level (the signal component Vsig) to a high frequency. In order to shortening an AD conversion period by reducing a measurement width (a count period) of the reference signal F1, it is advisable to set a frequency of the modulated signal Fout1 relatively higher than that in the case of the second example.

In this embodiment, the pixel signal voltage Vx is subjected to count processing after directly converting the pixel signal voltage Vx into the modulated signal Fout1 or the phase fluctuation width signal PWo. Thus, unlike the mechanism for generating a pulse width signal corresponding to a pixel signal voltage using a reference voltage and counting the pulse width with a predetermined counter clock as in the Non-Patent Document 1, it is possible to immediately start count processing at substantially the same time as a point when the modulated signal Fout1 or the phase fluctuation width signal PWo is stabilized, that is, the first readout from the unit pixels 3 in the arbitrary row Hx to the vertical data lines 18 (H1, H2, . . . ) is stabilized.

For example, if the modulated signal Fout1 or the phase fluctuation width signal PWo of the same frequency as the modulated signal Fout2 is counted according to the reference signal F1 or the modulated signal Fout2 of a high frequency, a count result is obtained at substantially the same time as a point when the first readout to the vertical data lines 18 (H1, H2, . . . ) is stabilized.

Even when the modulated signal Fout1 is divided and, then, subjected to count processing according to the reference signal F1 or a frequency of the modulated signal Fout2 is lowered to generate the phase fluctuation width signal PWo and the phase fluctuation width signal PWo is subjected to count processing according to the reference signal F1 or the modulated signal Fout2, a pulse width to be counted is set narrower than a time width from a point when the first readout from the unit pixels 3 in the arbitrary row Vx to the vertical data lines 18 (H1, H2, . . . ) is stabilized until the reset component ΔV and the reference voltage coincide with each other in the Non-Patent Document 1 and the like. This makes it possible to shorten a period (t32 to t36) from the point when the first readout is stabilized until the end of the count.

However, a frequency of the reference signal F1 or the modulated signal Fout2 (or the reference signal F1), that is, a clock frequency of count processing depends on a frequency that makes it possible to count one clock of the modulated signal Fout1 or the modulated signal Fout2 (or an active period of the modulated signal Fout1 or the modulated signal Fout2; in this example, the H level period) with a predetermined bit width. Thus, lock at higher speed may be required as a frequency of the modulated signal Fout1 or the modulated signal Fout2 is set higher. However, it is also possible to hold down the frequency by dividing the modulated signal Fout1 and, then, subjecting the modulated signal Fout1 to count processing.

In any case, it is possible to secure bit resolution equivalent to that in the past. For example, at the time of the first readout of the reset component ΔV, it is possible to compare the reset component ΔV by setting a longest period of count processing for the reset component ΔV to a count period for 7 bits (128 clocks). Even if bit resolution is secured in that way, it is possible to shorten the period (t32 to t36) from the point when the first readout is stabilized until the end of the count.

At the time of subsequent second readout (also referred to as D phase detection), the signal component Vsig corresponding to an amount of incident light for each of the unit pixels 3 is read out in addition to the reset component DV and an operation same as the first readout is performed. In other words, first, the driving signal operating unit 16 sets the pulse count processor 122 or the pulse count processor 128 in an up-count mode. After the second readout from the unit pixels 3 in an arbitrary row Hx to the vertical data lines 18 (H1, H2, . . . ) is stabilized, the driving signal operating unit 16 instructs the voltage/frequency converter 102, the voltage/phase converter 106, and the phase discriminator 126 to start processing. This is for the purpose of eliminating an influence on the peripheral part by actuating these units only when the actuation may be required. The voltage/frequency converter 102, the voltage/phase converter 106, the phase discriminator 126 may be always started.

In response to the instruction, the voltage/frequency converter 102 outputs a frequency corresponding to a pixel signal voltage of the arbitrary vertical data line 18 (Vx) supplied from the imaging area 10 as the modulated signal Fout1 (t42). The voltage/phase converter 106 outputs the modulated signal Fout2 of a predetermined frequency having phase fluctuation corresponding to the pixel signal voltage of the arbitrary vertical data line 18 (Vx) supplied from the imaging area 10 (t42). The phase discriminator 126 performs phase discrimination on the basis of the modulated signal Fout2 and outputs the phase fluctuation width signal PWo indicating phase fluctuation corresponding to the pixel signal voltage of the vertical data line 18 (Vx) (t42). In the figure, t42 is set at substantially the same point as the t20 in the related art. However, actually, since it is possible to perform the first processing earlier than that in the related art, it is possible to set an interval from completion of the first processing t36 to start of the second processing t42 shorter than an interval from completion of the first processing t12 to start of the second processing t20 in the related art.

In order to measure the number of pulses corresponding to pixel signals read out from the imaging area 10 in the second processing in the pulse count processor 122 or the pulse count processor 128 arranged in each row, at a point when an output of the modulated signal Fout1 or the phase fluctuation width signal PWo is stabilized, the driving signal operating unit 16 supplies the reference signal F1 or the reference signal F2 to the pulse count processor 122 or the pulse count processor 128. On the contrary, the driving signal operating unit 16 causes the pulse count processor 122 or the pulse count processor 128 to start up-count from a count value corresponding to the reset component ΔV of the unit pixel 3 acquired at the time of the first readout as a second count operation. In other words, driving signal operating unit 16 causes the pulse count processor 122 or the pulse count processor 128 to start count processing in a positive direction (t44).

In this case, the pulse count processor 122 or the pulse count processor 128 is subjected to count processing one clock width (an active period; in this example, only an H level is enough) of the reference signal F1 or the phase fluctuation width signal PWo in the positive direction according to the modulated signal Fout1 or the reference signal F2 (or the modulated signal Fout2).

When the pulse count processor 122 or the pulse count processor 128 ends counting of the one clock width, the pulse count processor 122 or the pulse count processor 128 stops the count operation and latches (holds or stores) a count value at that point as pixel data to complete AD conversion (t46). In other words, at the time of the second readout, the pulse count processor 122 or the pulse count processor 128 counts one clock of the modulated signal Fout1 or the phase modulation width signal PWo according to the reference signal F1 or the reference signal F2 to obtain a count value corresponding to a magnitude of the signal component Vsig.

At the time of this second readout, count processing is applied to the signal component Vsig in the pixel signal voltage Vx. Thus, the signal component Vsig of the unit pixel 3 is readout.

In this embodiment, the count operation in the pulse count processor 122 or the pulse count processor 128 is the down-count at the time of the first readout and is the up-count at the time of the second readout. Thus, a subtraction indicated by Expression 1 is automatically performed in the pulse count processor 122 or the pulse count processor 128. A count value corresponding to a result of this subtraction is held in the pulse count processor 122 or the pulse count processor 128.

$$\text{(Count value in a second comparison period)} - \text{(Count value in a first comparison period)} \quad 1$$

It is possible to transform Expression 1 to Expression 2. As a result, a count value held in the pulse count processor 122 or the pulse count processor 128 is a count value corresponding to the true signal component Vsig.

$$\text{(Second comparison period)} - \text{(First comparison period)} =$$
$$\text{(Signal component } Vsig + \text{Reset component } \Delta V +$$
$$\text{Offset component of the column signal processor 2)} -$$
$$\text{(Reset component } \Delta V + \text{Offset component of the column}$$
$$\text{signal processor 22)} = \text{(Signal component } Vsig)2$$

As described above, according to subtraction processing in the pulse count processor 122 or the pulse count processor 128 according to the readout and the count processing performed twice, namely, the down-count at the time of the first readout and the up-count at the time of the second readout, it is possible to remove the reset component $\Delta V$ including fluctuation for each of the unit pixels 3 and the offset component for each of the column signal processors 22. This makes it possible to extract only the signal component Vsig corresponding to an amount of incident light for each of the unit pixels 3 with a simple constitution.

Even if there is individual variation in the components in the column signal processor 22, that is, individual variation (frequency offset or phase offset) in the voltage/frequency converter 102, the voltage/phase converter 106, or the phase discriminator 126 of the signal converter 100, it is possible to remove the individual variation. In this case, there is an advantage that it is possible to remove reset noise in pixel signals.

Thus, the column signal processor 22 (the signal converter 100 and the AD converter 120) in this embodiment operates not only as a digital converter that converts an analog pixel signal into digital pixel data but also as a Correlated Double Sampling (CDS) processing function unit.

Since pixel data indicated by a count value obtained by Expression 2 indicates a positive signal voltage, a complementary operation and the like are unnecessary. Thus, affinity with the existing system is high.

At the time of the second readout, the pixel signal voltage Vx is directly converted into the modulated signal Fout1 or the phase fluctuation width signal PWo and, then, subjected to count processing. Thus, like count processing for the reset level Vrst, it is possible immediately start count processing at substantially the same time as a point when the modulated signal Fout1 or the phase fluctuation width signal PWo is stabilized, that is, a point when the second readout from the unit pixels 3 in the arbitrary row Hx to the vertical data lines 18 (H1, H2, . . . ) is stabilized.

If the modulated signal Fout1 itself or the phase fluctuation width signal PWo of the same frequency as the modulated signal Fout2 is counted according to the reference signal F1 or the modulated signal Fout2 of a high frequency, a result of the count is obtained at substantially the same time as a point when the second readout to the vertical data lines 18 (H1, H2, . . . ) is stabilized.

Even when the modulated signal Fout1 is divided and, then, subjected to count processing according to the reference signal F1 or a frequency of the modulated signal Fout2 is lowered to generate the phase fluctuation width signal PWo and the phase fluctuation width signal PWo is subjected to count processing according to the reference signal F1 or the modulated signal Fout2, a pulse width to be counted is set narrower than a time width from a point when the second readout from the unit pixels 3 in the arbitrary row Hx to the vertical data lines 18 (H1, H2, . . . ) is stabilized until the reset component $\Delta V$ and the reference voltage coincide with each other in the Non-Patent Document 1 and the like. This makes it possible to shorten a period (t42 to t46) from the point when the second readout is stabilized until the end of the count.

In the mechanism for generating a pulse width signal corresponding to a pixel signal voltage using a reference voltage and counting the pulse width with a predetermined counter clock as in the Non-Patent Document 1, the signal component Vsig corresponding to an amount of incident light is read out at the time of the second readout. Thus, in order to judge a magnitude of a light amount in a wide range, it is necessary to set an up-count period (t20 to t24; a comparison period) long and change the reference voltage by a large degree. This is significantly different from processing in which a long time may be required for count processing.

According to the mechanism in this embodiment, it is possible to complete both count processing for the reset component $\Delta V$ (the reference component) and count processing for the signal component Vsig substantially simultaneously with a point when a pixel signal voltage read out from the imaging area 10 is stabilized. This makes it possible to significantly shorten a total AD conversion period for the processing performed twice.

Since it is easy to set the reference signal F1 and the reference signal F2 used in the first processing same as those used in the second processing, it is possible to easily equalize accuracy of AD conversion in the first processing and accuracy of AD conversion in the second processing. Consequently, a result of the subtraction indicated by Expression 1 by the up-down counter is correctly obtained. In order to easily equalize accuracy of AD conversion in the first processing and accuracy of AD conversion in the second processing in the mechanism described in the Non-Patent Document 1, it is necessary to maintain an inclination of a reference signal constant. This is significantly different from processing in which it is necessary to take into account factors of instability.

At predetermined timing after the second count processing is completed, the driving signal operating unit 16 instructs the horizontal scanning unit 12 to read out pixel data. In response to the instruction, the horizontal scanning unit 12 sequentially shifts horizontal selection signals CH(i) supplied to the horizontal selection switch unit 60, that is, horizontal readout pulses φg1 to φgh. In the figure, readout is started at substantially the same point as t28 in the related art. However, actually, since it is possible to perform the second processing earlier than that in the related art. Thus, it is possible to set an interval from completion of the second processing t46 until start of readout shorter than an interval from completion of the second processing t22 until start of readout t28 in the related art.

Consequently, count values indicated by Expression 2 stored and held in the pulse count processor 122 or the pulse count processor 128, that is, pixel data represented by n-bit digital data are sequentially outputted to the outside of the column signal processor 22 or to the outside of the chip including the imaging area 10 from the output terminal 88a via the n horizontal data lines 86. Thereafter, the same operation is sequentially repeated for each of the rows. As a result, video data representing a two-dimensional image is obtained.

As explained above, according to the solid-state imaging device according to the first embodiment, count processing is performed twice by switching a processing mode of the solid-state imaging device while using the up-down counter. In the constitution in which the unit pixels 3 are arranged in a matrix shape, the column signal processors 22 are constituted by the parallel column AD circuit provided for each of the vertical columns.

Therefore, it is possible to directly acquire a result of subtraction processing of a reference component (a reset component) and a signal component for each of the vertical columns as a result of the second count processing. It is possible to realize a memory device that holds respective count results of the reference component and the signal component according to the latch function provided in the count processor. It is unnecessary to prepare a special-purpose memory device that holds data subjected to AD conversion separately from the counter.

In addition, a special subtracter for calculating a difference between the reference component and the signal component becomes unnecessary. Thus, it is possible to reduce a circuit size and a circuit area compared with the constitution in the past. It is also possible to solve an increase in noise or an increase in an electric current or power consumption.

The column AD circuit (the AD converter) is adapted to perform AD conversion by converting a pixel signal of a voltage mode into an FM modulated signal (the modulated signal Fout1) related to a frequency or a PM modulated signal (the modulated signal Fout2) in the signal converter 100 and, then, perform count processing. Thus, problems of a line resistance, a wiring capacity, a total capacity of gates connected, a substrate bias effect, and the like due to extension of a ramp data line become unrelated to the FM modulated signal (the modulated signal Fout1) and the PM modulated signal (the modulated signal Fout2). Thus, influences of the substrate bias effect, the wiring length, and the like do not appear in a result of AD conversion.

It is possible to control count processing with one counter clock that actuates the count processor regardless of the number of bits and a control line that switches a count mode. A data line leading a count value of the count processor to the memory device required in the constitution in the past becomes unnecessary. It is possible to solve an increase in noise and an increase in power consumption. Moreover, it is possible to acquire a count result and complete the AD conversion processing substantially simultaneously with a point when the pixel signal voltage Vx read out from the imaging area 10 is stabilized.

In the solid-state imaging device 1 in which AD converters are mounted on the identical chip, a column AD circuit serving as the AD converter is constituted by forming a voltage comparator 252 and the pulse count processor 122 or the pulse count processor 128 as a pair. As an operation of the pulse count processor 122 or the pulse count processor 128, the pulse count processor 122 or the pulse count processor 128 changes a difference between a basic component (in this embodiment a reset component) and a signal component of a processing object signal to digital data while using down-count and up-count in combination. This makes it possible to solve the problems of a circuit size, a circuit area, power consumption, the number of wirings for interface between the solid-state imaging device 1 and other functional units, noise and a consumed current due to the wiring, and the like. Moreover, it is possible to remarkably reduce time for the AD conversion processing.

Operations of a Solid-State Imaging Device; First Embodiment; Second Example

Figure 4:
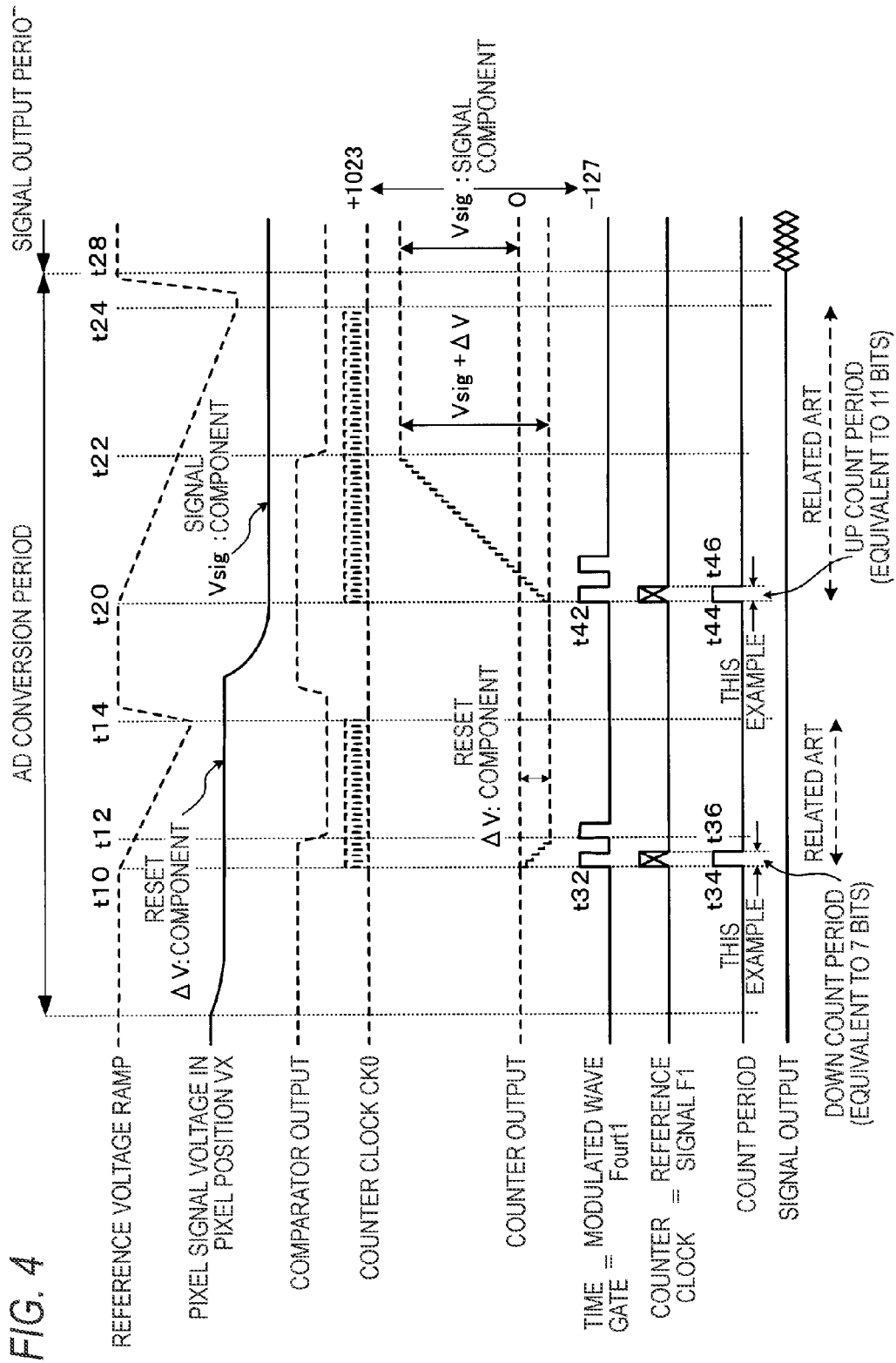
FIG. 4 is a timing chart for explaining operations in a column signal processor (in particular, a signal converter and an AD converter) of a solid-state imaging device in a second example of the first embodiment shown in FIG. 1A.

FIG. 4 is a timing chart for explaining operations in the column signal processor 22 (in particular, the signal converter 100 and the AD converter 120) of the solid-state imaging device 1 in a second example of the first embodiment shown in FIGS. 1A and 1B. In this second example, as shown in FIG. 2B, the reference signal F1 serving as a counter clock of a high frequency supplied from the outside is counted with modulated signal Fout1 as a time gate signal.

In order to measure the number of pulses corresponding to pixel signals readout from the imaging area 10 in the first processing in the pulse count processor 122 or the pulse count processor 128 arranged in each row, at a point when an output of the modulated signal Fout1 or the phase fluctuation width signal PWo is stabilized, the driving signal operating unit 16 supplies the reference signal F1 to the pulse count processor 122 and causes the pulse count processor 122 to start count processing.

In this case, at the time of a first count operation for the reset component ΔV (t34), the driving signal operating unit 16 causes the pulse count processor 122 to start down-count from an initial value "0". On the contrary, at the time of a second count operation for the signal component Vsig, the driving signal operating unit 16 causes the pulse count processor 122 to start up-count from a count value corresponding to the reset component ΔV of the unit pixels 3 held after end of the first count operation. In other words, the driving signal operating unit 16 causes the pulse count processor 122 to start count processing in a positive direction.

In this case, the pulse count processor 122 subjects, using the modulated signal Fout1 outputted from the voltage/frequency converter 102 as a time gate signal, one pulse width of the time gate signal to count processing with the reference signal F1 supplied from the outside as a counter clock. In order to hold down a frequency of the reference signal F1, it is advisable to hold down a frequency of the modulated signal Fout1 to be relatively lower than that in the case of the first example. When a frequency of the modulated signal Fout1 is as high as that in the first example, a frequency of the reference signal F1 may be held down by subjecting a period equivalent to plural modulated signals Fout1 to count processing, for example, dividing the modulated signal Fout1 and counting one pulse width of a divided pulse.

In the following processing, as in the first example, when the pulse count processor 122 or the pulse count processor 128 ends counting of the one clock width, the pulse count processor 122 or the pulse count processor 128 stops the count operation and latches (holds or stores) a count value at that point as pixel data to complete AD conversion (t36/t46).

As explained above, forms of count processing are different in the first example and the second example. In the first example, the phase fluctuation width signal PWo corresponding to the reference signal F1 or the reference signal F2 supplied from the outside is set as a count object and counted according to an output signal (the modulated signal Fout1 or Fout2 itself or the reference signal F2 corresponding to the modulated signal Fout2) of the signal converter 100. On the other hand, in the second example, an output signal (the modulated signal Fout1 itself) of the signal converter 100 is set as a count object and counted according to the reference signal F1 supplied from the outside. Otherwise, the second example is not different from the first example.

Therefore, in the second example, as in the first example, it is possible to acquire a count result and complete the AD conversion processing substantially simultaneously with a point when the pixel signal voltage Vx read out from the imaging area 10 is stabilized. This makes it possible to remarkably reduce time for the AD conversion processing.

Even when the modulated signal Fout1 is divided to be a time gate signal and, then, subjected to count processing according to the reference signal F1, it is possible to shorten a period (t32 to t36 or t42 to t46) from a point when readout of pixel signal is stabilized until end of the count by setting a pulse width of the time gate signal to be counted narrow. This makes it possible to shorten a total AD conversion period for processing performed twice.

Schematic Constitution of an Imaging Apparatus; Second Embodiment

Figure 5:
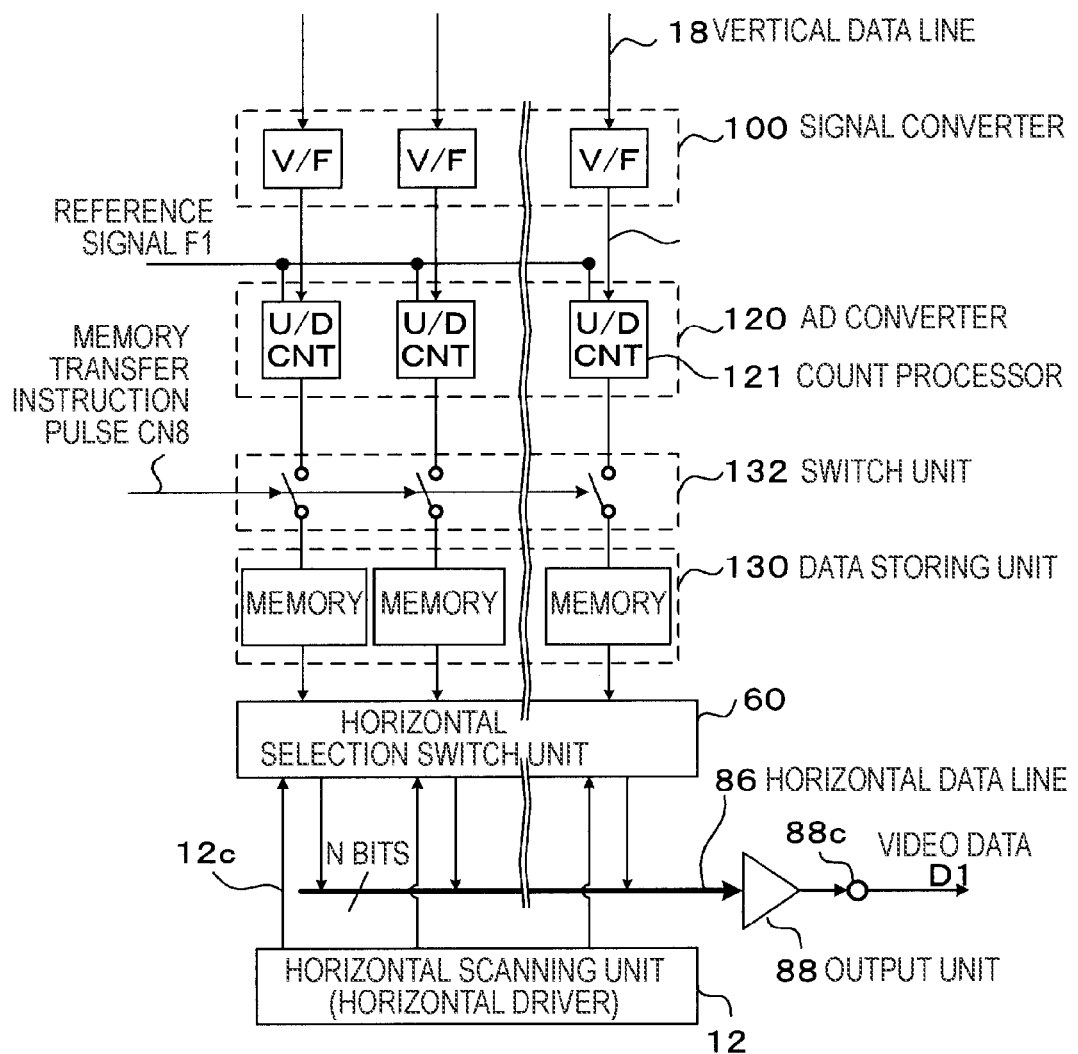
FIG. 5 is a schematic diagram of a CMOS solid-state imaging device that is a form of a physical information acquiring device according to a second embodiment of the invention.

FIG. 5 is a schematic diagram of a CMOS solid-state imaging device that is a form of a physical information acquiring device according to a second embodiment of the invention. In particular, focusing on the column processor 20, the column processor 20 is shown together with main peripheral units thereof. In the solid-state imaging device 1 in the second embodiment, compared with the solid-state imaging device 1 in the first embodiment, a constitution of the column signal processor 22 (in particular, a post stage circuit of the AD converter 120) is transformed.

The column signal processor 22 in the second embodiment includes, at a post stage thereof (specifically, a post stage of the pulse count processor 122 or the pulse count processor 128 in FIG. 2; collectively referred to as the count processor 121), a data storing unit 130 serving as an n-bit memory device that holds a count result held by the AD converter 120 and a switch unit 132 arranged between the count processor 121 and the data storing unit 130. The horizontal selection switch unit 60 is arranged between the data storing unit 130 and the horizontal data line 86.

A memory transfer instruction pulse CN8 is supplied to respective switches in the switch unit 132 in common with switches in other vertical columns from the driving signal operating unit 16 at predetermined timing. When the memory transfer instruction pulse CN8 is supplied to the switch unit 132, the switch unit 132 transfers a count value of the count processor 121 corresponding thereto to the data storing unit 130. The data storing unit 130 holds and stores the count value transferred.

A mechanism for causing the data storing unit 130 to hold a count value of the count processor 121 at predetermined timing is not limited to arrangement of the switch unit 132 between both the units. For example, it is possible to realize the mechanism by controlling output enable of the count processor 121 according to the memory transfer instruction pulse CN8 while directly connecting the count processor 121 and the data storing unit 130. It is also possible to realize the mechanism by using the memory transfer instruction pulse CN8 as a latch clock for determining data capturing timing of the data storing unit 130.

Horizontal selection signals CH(i), that is, horizontal readout pulses φg1 to φgh are inputted to the horizontal selection switch unit 60 at a post stage of the data storing unit 130 from the horizontal scanning unit 12 (the horizontal driver 12y) via control lines 12c. The horizontal selection switch unit 60 causes the data storing unit 130 to hold the count value captured from the count processor 121 until an instruction by a control pulse is received via the control lines 12c.

The horizontal scanning unit 12 and the horizontal selection switch unit 60 have a function of a readout scanning unit that reads out count values held by the respective data storing unit 130 in parallel with processing carried out by the respective signal converters 100 and the respective count processors 121 of the column signal processor 22.

According to such a constitution in the second embodiment, it is possible to transfer a count result held by the count processor 121 to the data storing unit 130. Thus, it is possible to control a count operation, that is, AD conversion processing of the count processor 121 and a readout operation for reading out the count result to the horizontal data line 86 independently from each other. This makes it possible to realize a pipeline operation for performing the AD conversion processing and the readout operation for reading out a signal to the outside in parallel.

Operations of the Solid-State Imaging Device; Second Embodiment

Figure 6:
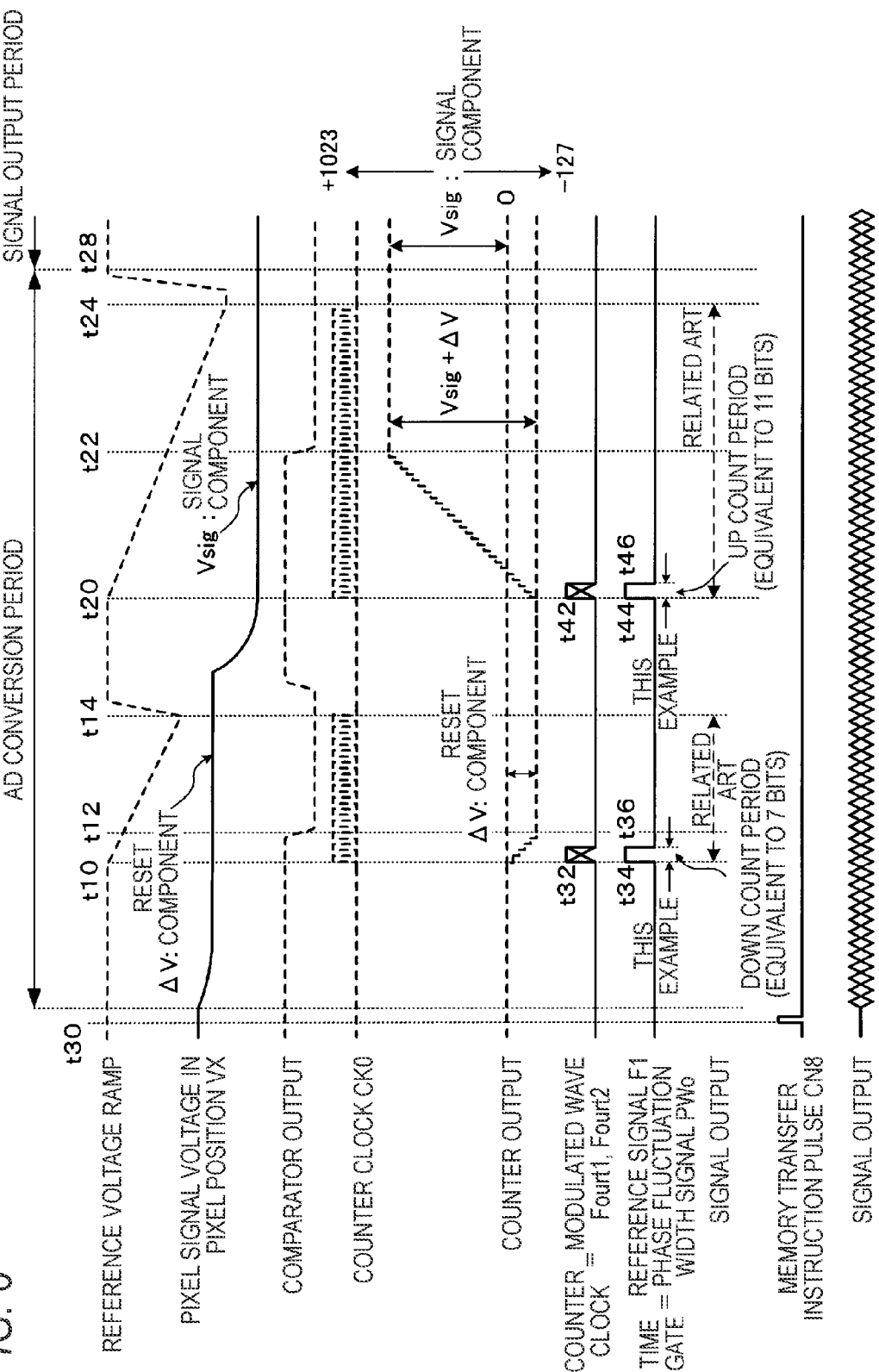
FIG. 6 is a timing chart for explaining operations in a column signal processor (in particular, a signal converter and an AD converter) of the solid-state imaging device in the second embodiment shown in FIG. 5.

FIG. 6 is a timing chart for explaining operations in the column signal processor 22 (in particular, the signal converter 100 and the AD converter 120) of the solid-state imaging device 1 in the second embodiment shown in FIG. 5. The second embodiment is described as a modification to the first example of the first embodiment. It is also possible to modify and apply the second embodiment to the second example. AD conversion processing in the column signal processor 22 is the same as that in the first embodiment. Detailed explanations of the AD conversion processing are omitted.

In the second embodiment, the data storing unit 130 is added to the constitution in the first embodiment. Basic operations such as the AD conversion processing are the same as those in the first embodiment. However, before the operation of the pulse count processor 122 or the pulse count processor 128 (t32), a count result of a preceding row Hx-1 is transferred to the data storing unit 130 on the basis of the memory transfer instruction pulse CN8 from the driving signal operating unit 16.

In the first embodiment, pixel data can be outputted to the outside of the column signal processor 22 only after the second readout processing, that is, the AD conversion processing is completed. Thus, there is a limitation on the readout processing. On the other hand, in the constitution in the second embodiment, a count value indicating the last subtraction processing result is transferred to the data storing unit 130 prior to the first readout processing (AD conversion processing). Thus, there is no limitation on the readout processing.

Consequently, it is possible to perform a signal output operation for outputting a signal to the outside from the data storing unit 130 through the horizontal data line 86 and the output unit 88, readout of the present row Hx, modulation processing by the signal converter 100, and a count operation of the pulse count processor 122 or the pulse count processor 128 in parallel. It is possible to set a column readout and AD period itself in a 1H period. This makes it possible to perform more efficient signal output.

The second embodiment is different from the first embodiment in that the data storing unit 130 and the switch unit 132 are provided at the post stage of the AD converter 120 as components for the pipeline operation. Otherwise, the second embodiment is the same as the first embodiment. Therefore, in the second embodiment, as in the first embodiment, it is possible to acquire a count result substantially simultaneously with a point when the pixel signal voltage Vx read out from the imaging area 10 is stabilized and complete the AD conversion processing. This makes it possible to remarkably reduce time for the AD conversion processing.

For example, in the constitution in the first embodiment, in the 1H period (e.g., 63.3 µs), the column readout and AD period for readout of a pixel signal from the imaging area 10 and the AD conversion processing is about 8.5 µs and a horizontal transfer period is 54.8 µs. On the other hand, it is possible to set the column readout and AD period of 8.5 µs itself as the 1H period (8.5 µs).

Schematic Constitution of an Imaging Apparatus; Third Embodiment; First Example

FIGS. 7A and 7B and FIGS. 8A and 8B are diagrams for explaining a CMOS solid-state imaging device that is a form of a physical information acquiring device in a first example of a third embodiment of the invention. The third embodiment is described as a modification to the first embodiment. It is also possible to modify and apply the third embodiment to the second embodiment.

The solid-state imaging device 1 in the third embodiment has a characteristic in that the signal converter 100 is built in the imaging area 10. In particular, in the first example, the solid-state imaging device 1 has a characteristic in that the signal converter 100 is provided for each of the unit pixel 3 and an output of the signal converter 100 is passed to the AD converter 120 of the column signal processor 22 for each of the vertical columns. In other words, the solid-state imaging device 1 has a characteristic in that one AD converter 120 is allocated to one charge generator 32, one pixel signal generator 33, and one signal converter 100.

Figure 7A:
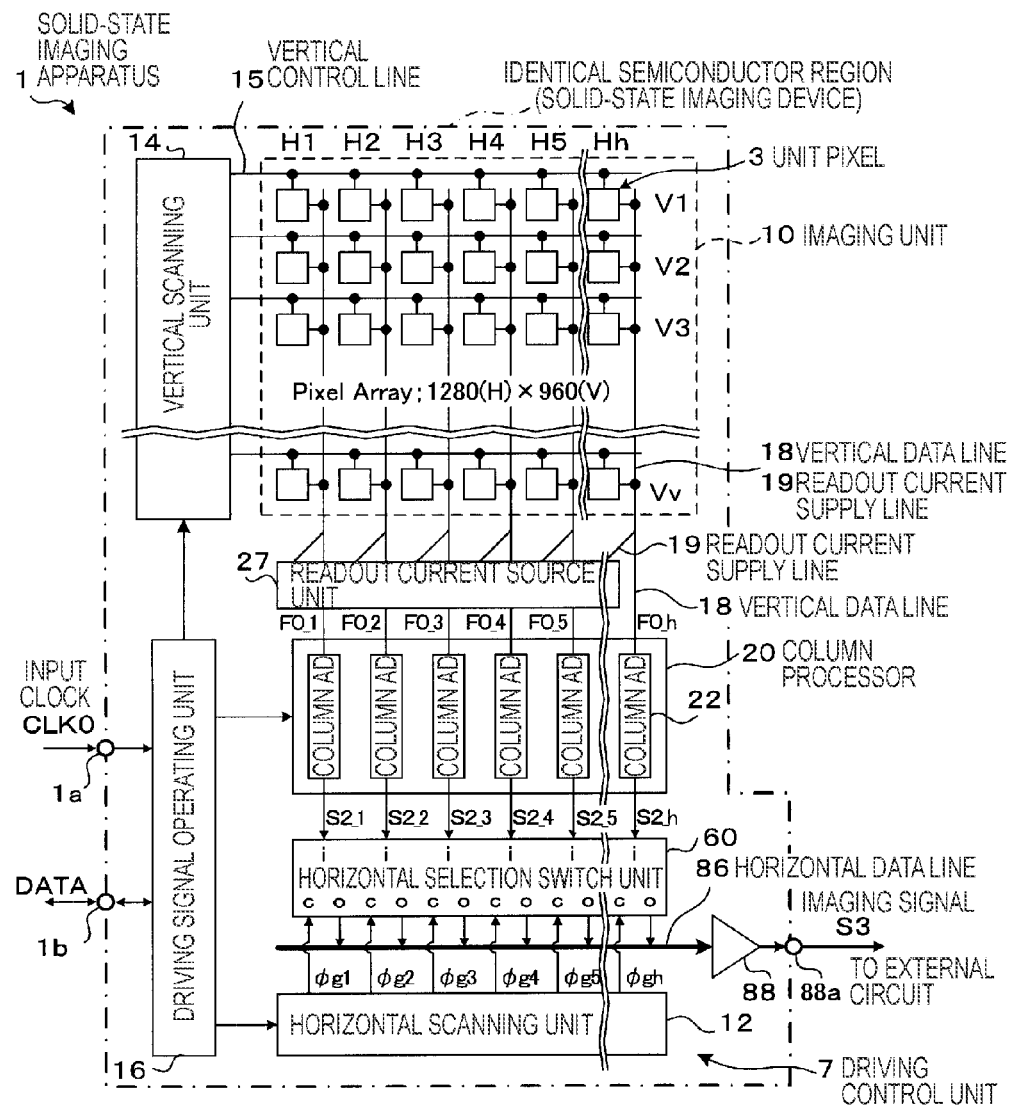
FIGS. 7A and 7B are diagrams for explaining a CMOS solid-state imaging device that is a form of a physical information acquiring device in a first example of a third embodiment of the invention.
Figure 7B:
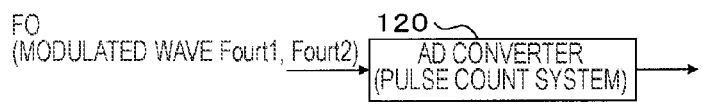

As shown in FIG. 7B, the column signal processor 22 in the column processor 20 includes the AD converter 120 that performs pulse count processing on the basis of frequency information (the modulated signal Fout1) or phase information (the modulated signal Fout2) (also referred to collectively as modulated signal F0) outputted from the signal converter 100. Therefore, in FIG. 7A schematically showing an overall constitution of the solid-state imaging device 1, the column signal processor 22 is represented as a column AD.

Figure 8A:
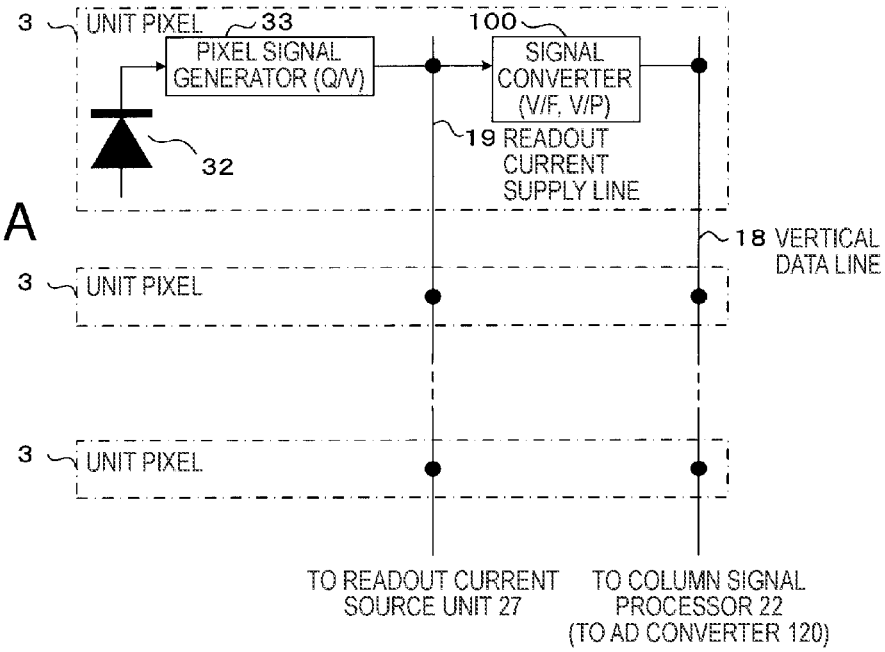
FIGS. 8A and 8B are diagrams for explaining the CMOS solid-state imaging device that is a form of the physical information acquiring device in the first example of the third embodiment of the invention.

As shown in FIG. 8A, each of the unit pixels 3 in the imaging area 10 includes the charge generator 32 that detects a signal charge and the pixel signal generator 33 serving as an in-pixel amplifier that generates a pixel signal of a voltage mode on the basis of the signal charge generated by the charge generator 32.

Constitutions of the charge generator 32 and the pixel signal generator 33 are the same as those of the usual CMOS image sensor. In this embodiment, it is possible to use a general-purpose CMOS sensor with the 4TR constitution as a CMOS sensor. It is also possible to use a CMOS sensor with the 3TR constitution including three transistors as described in Japanese Patent No. 2708455. It goes without saying that these pixel constitutions are only examples. It is possible to use any CMOS sensor as long as the CMOS sensor has an array constitution of the usual CMOS image sensor.

Figure 8B:
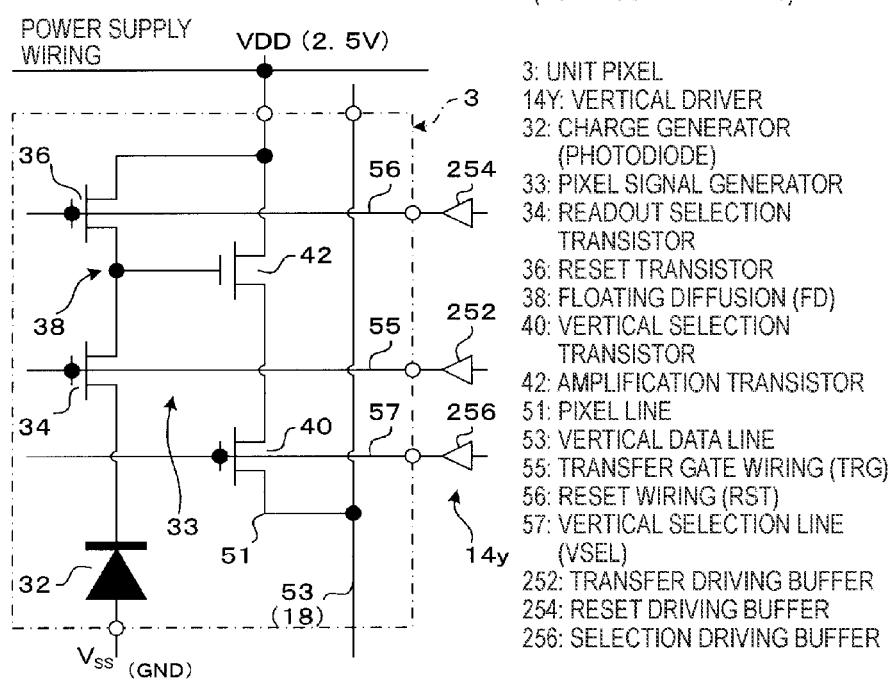

The in-pixel amplifier (the pixel signal generator 33) only has to be an in-pixel amplifier of a charge/voltage conversion (Q/V) system that is capable of converting a signal charge generated by the charge generator 32 into a pixel signal of a voltage mode. For example, an in-pixel amplifier of a floating diffusion amplifier constitution is used. As an example, as shown in FIG. 8B it is possible to use the pixel signal generator 33 that includes, in association with the charge generator 32, a readout selection transistor 34 that is an example of a charge readout unit (a transfer gate unit/a readout gate unit), a reset transistor 36 that is an example of a reset gate unit, a vertical selection transistor 40, and an amplification transistor 42 of a source follower constitution that is an example of a detection element for detecting a potential change in a floating diffusion 38.

A lateral wiring is common for pixels in an identical row. All the unit pixels 3 in the identical row are simultaneously controlled to be driven by the vertical driver 14y of the vertical scanning unit 14. For example, a transfer driving buffer 252, a reset driving buffer 254, and a selection driving buffer 256 are housed in the vertical driver 14y.

As wiring for the unit pixel 3, three lines, namely, a transfer gate wiring (a readout selection line TRG) 55, a reset wiring (RST) 56, and a vertical selection line (SEL) 57 for row address selection, are laid in a lateral direction. The vertical data line 18 and a drain line (a Vdd supply wiring) are laid in a longitudinal direction. Internal wirings (wirings in the pixel) for, for example, connecting the floating diffusion 38 and a gate of the amplification transistor 42 are laid. Moreover, although not shown in the figure, a secondary wiring used for a light shielding film for a pixel boundary portion and a black level detection pixel is present.

An output side of the amplification transistor 42 is connected to the readout current source unit 27 via the readout current supply line 19. Consequently, when a signal is read out, a source follower is formed between load MOS transistors in the readout current source unit 27 and the amplification transistors 42 in a selected row to continue to feed a constant current decided in advance to the amplification transistor using the load MOS transistors connected to the respective amplification transistors 42 (see FIG. 7A). There is a problem in that a current consumption amount increases. However, the readout current supply line 19 may be removed to always supply an electric current to the amplification transistor 42 of a source follower output.

As a characteristic part of the third embodiment, the solid-state imaging device 1 includes the signal converter 100 that performs FM modulation and PM modulation on the basis of a pixel signal of a voltage mode at the post stage of the pixel signal generator 33. A signal charge generated by the charge generator 32 is converted into a pixel signal of a voltage mode by the pixel signal generator 33 and, then, a carrier signal is converted into a signal related to a frequency by the signal converter 100. Thus, there is an advantage that it is possible to use an FM modulation circuit and a PM modulation circuit using a general-purpose VCO.

An output of the signal converter 100 is connected to the vertical data line 18 having a function of a signal readout line for a pixel signal in common with the signal converters 100 in the identical vertical column. The modulated signal F0 (Fout1 or Fout2) corresponding to a signal charge acquired by the unit pixel 3 is supplied to the AD converter 120 in the column signal processor 22 (see FIG. 7A).

By forming the transistor output of the signal converter 100 in the source follower constitution connected to the readout current source unit 27, it is also possible to form a source follower between load MOS transistors in the readout current source unit 27 and transistors in a selected row when a signal is read out and continue to feed a constant current to the transistors using the load MOS transistors connected to the respective transistors.

Figure 9A:
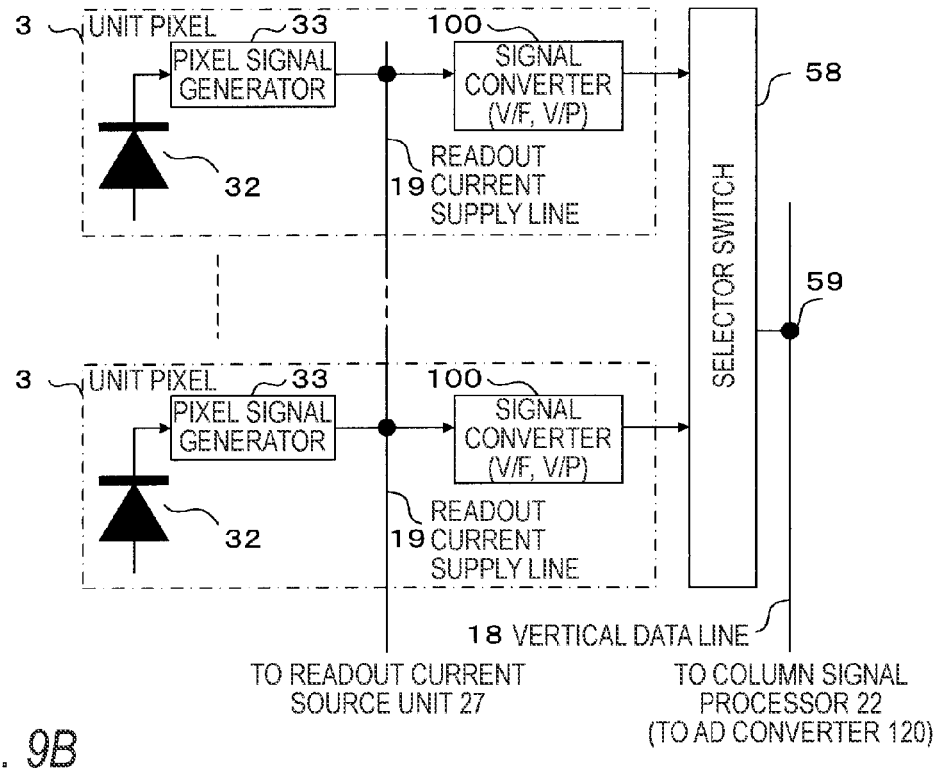
FIGS. 9A and 9B are diagrams for explaining a CMOS solid-state imaging device that is a form of a physical information acquiring device in a second example of the third embodiment of the invention.
Figure 9B:
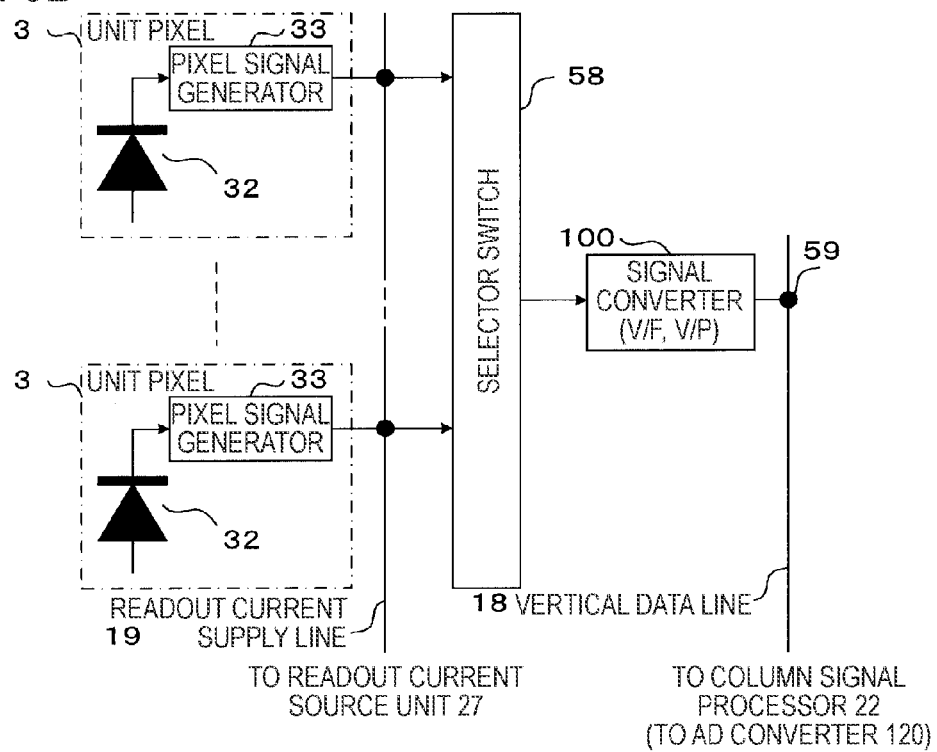

Schematic Constitution of an Imaging Apparatus; Third Embodiment; Second Example FIGS. 9A and 9B are diagrams for explaining the CMOS solid-state imaging device that is a form of the physical information acquiring device in a second example of the third embodiment of the invention. The second example is described as a modification to the first example of the third embodiment.

The solid-state imaging device 1 in the second example of the third embodiment has a characteristic in that the signal converter 100 is built in the imaging area 10 and one AD converter 120 is allocated to the charge generators 32 and the pixel signal generators 33 in plural vertical columns to make it possible to reduce an overall circuit size for signal modulation.

In this case, in order to allocate one AD converter 120 to the plural charge generators 32 and the plural pixel signal generators 33, a selector switch 58 is provided between an output side of the unit pixels 3 and the vertical data line 18. The modulated signal F0 (Fout1 or Fout2) selected by the selector switch 58 is supplied to the AD converter 120 from a single output terminal 59 of the selector switch 58 via the vertical data line 18. The selector switch 58 functions as a selection switching unit that allocates one signal converter 100 to the plural unit pixels 3. A control signal designating a readout row is inputted to the selector switch 58 as a switching control signal.

Therefore, although not shown in the figure, the AD converters 120, the number of which is decided taking into account the AD converter 120 to be allocated, are provided in the column processor 20. As a constitution in which the number of AD converters 120 is maximized, it is possible to allocate one AD converter 120 to two charge generators 32 and two pixel signal generators 33. As a constitution in which the number of AD converters 120 is minimized, it is possible to allocate one AD converter 120 to the charge generators 32 and the pixel signal generators 33 in all vertical columns.

One AD converter 120 only has to be allocated to the plural charge generators 32 and the plural pixel signal generators 33. For example, as shown in FIG. 9A, it is also possible to provide the signal converters 100 in the respective pixels and arrange the selector switch 58 at the post stage of the respective signal converters 100. In this case, the selector switch 58 has a function of a selection switching unit that allocates one output terminal 59 or allocating one AD converter 120 to the plural signal converters 100. Alternatively, as shown in FIG. 9B, it is also possible to reduce the number of signal converters 100 by arranging the selector switch 58 at a pre-stage of the signal converters 100 to remarkably reduce an overall circuit size for signal modulation. In this case, the selector switch 58 has a function of a selection switching unit that allocates the single output terminal 59 or allocates the one signal converter 100 to the plural unit pixels 3.

If the constitution in the third embodiment is adopted, regardless of the first example and the second example, the modulated signal F0 (Fout1 or Fout2) corresponding to a signal charge acquired by each of the unit pixels 3 is transmitted to the column processor 20 provided outside the imaging area 10. This is a mechanism that is the same as the mechanism of information transmission by the human eyes.

Operations of the signal converter 100 and the AD converter 120 are the same as those in the first embodiment. In this third embodiment, as in the first embodiment, it is possible to acquire a count result and complete the AD conversion processing substantially simultaneously with a point when the pixel signal voltage Vx read out from the imaging area 10 is stabilized. This makes it possible to remarkably reduce time for the AD conversion processing.

Since the units including the signal converter 100 is arranged in the imaging area 10 and the AD converter 120 is left in the column processor 20, it is possible to realize an effect that cannot be obtained in the constitution adopted in the past.

As it is seen from FIGS. 8 and 9, a size of the unit pixels 3 increases because of the addition of the signal converter 100. In the second example, since it is necessary to arrange the selector in the imaging area 10, an area of the entire imaging area 10 also increases. This makes it difficult to realize high density.

It is necessary to arrange the readout current supply lines 19 other than the vertical data lines 18 for signal readout. Thus, in forming a wiring layer that forms wiring to active elements of the imaging area 10, the readout current supply lines 19 maybe a factor in blocking light in a surface sensor having a usual pixel structure of a surface light receiving type that takes light into a photoelectric conversion element from the same surface side as the wiring layer.

In order to solve these problems, as described later, a sensor structure of a back-illuminated type only has to be adopted. In the back-illuminated type, a pixel structure of a back light receiving type is adopted. In the pixel structure of the back light receiving type, a wiring layer that forms wiring to active elements and a layer in which other circuit members are arranged are formed on one surface side of an element layer in which a photoelectric conversion element is formed and incident light is taken into the photoelectric conversion element from the other surface side of the element layer, that is, a surface side opposite to the wiring layer and the layer in which the other members are arranged. Wiring and circuit member arrangement taking into account a light-receiving surface are made unnecessary by adopting such a pixel structure of the back light receiving type. In other words, it is possible to lay wiring onto a photoelectric conversion element area without worrying about the problem of light blocking by the wiring and the circuit members. Thus, a degree of freedom of wiring and arrangement of circuit members is improved.

However, even when the back-illuminated type is adopted, in order to prevent an increase in a size as the entire imaging area 10 while reducing the number of layers for wiring and circuit members on the opposite side of the light incident surface, it is preferable to reduce circuit sizes of the signal converter 100 and the selector switch 58. It is considered appropriate to adopt the constitution shown in FIG. 9B that can reduce the number of signal converters 100.

Figure 10:
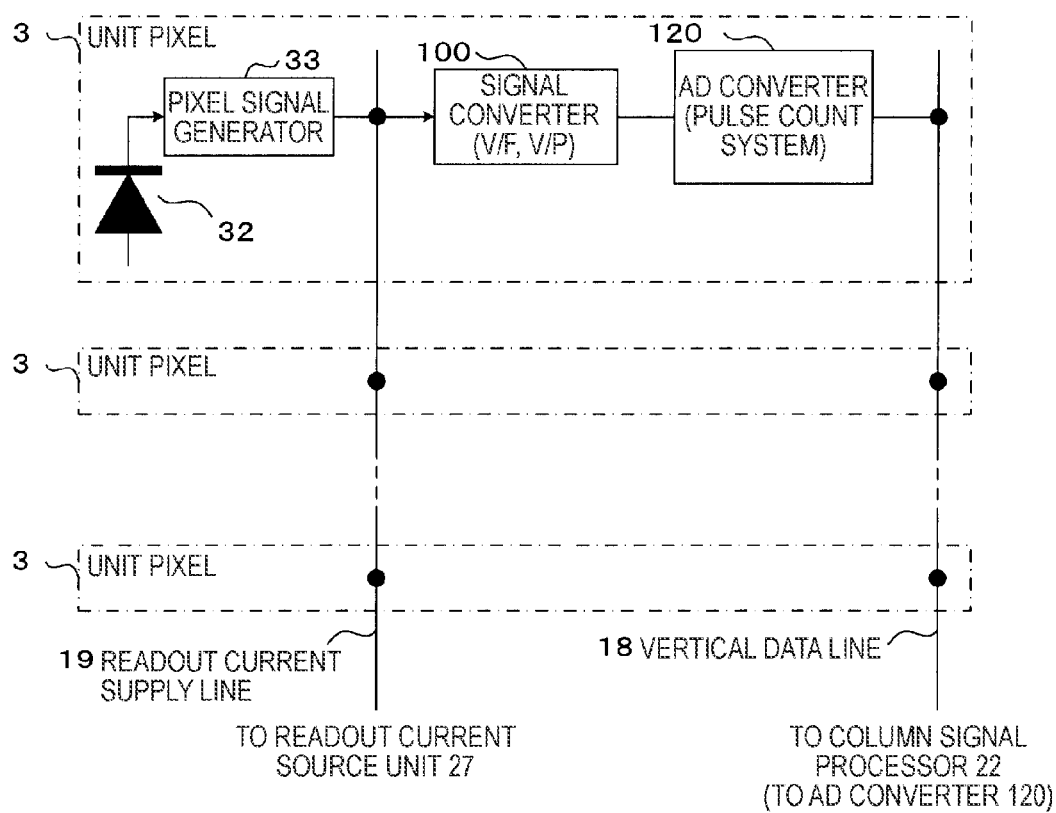
FIG. 10 is a diagram for explaining a CMOS solid-state imaging device that is a form of a physical information acquiring device in a first example of a fourth embodiment of the invention.

Schematic Constitution of an Imaging Apparatus; Fourth Embodiment; First Example FIG. 10 is a diagram for explaining a CMOS solid-state imaging device that is a form of a physical information acquiring device in a first example of a fourth embodiment of the invention. The first example is described as a modification to the first example of the third embodiment. The solid-state imaging device 1 in the fourth embodiment has a characteristic in that not only the signal converter 100 but also the AD converter 120 is built in the imaging area 10.

In particular, in the first example, the solid-state imaging device 1 has a characteristic in that the signal converter 100 and the AD converter 120 are provided for each of the unit pixels 3 and outputs of the signal converter 100 and the AD converter 120 are taken out to the outside of the imaging area 10 for each of vertical columns. Although not shown in the figure, the AD converter 120 is provided in the imaging area 10. It is possible to immediately pass an output of the AD converter 120 to the output unit 88 via the horizontal selection switch unit 60 and the horizontal data line 86.

As shown in FIG. 10, each of the unit pixels 3 in the imaging area 10 includes the charge generator 32 that detects a signal charge and the pixel signal generator 33 serving as an in-pixel amplifier that generates a pixel signal of a voltage mode on the basis of the signal charge generated by the charge generator 32.

As a characteristic part of the third embodiment, the signal converter 100 and the AD converter 120 are provided at the post stage of the pixel signal generator 33 in this order. An output of the AD converter 120 is connected to the vertical data line 18 serving as an output line of a pixel signal in common with the AD converter 120 in the identical vertical column. A counter value acquired by the AD converter 120 on the basis of the modulated signal F0 (Fout1 or Fout2) corresponding to a signal charge acquired by the unit pixel 3 is supplied to the output unit 88 via the horizontal selection switch unit 60 and the horizontal data line 86.

Figure 11A:
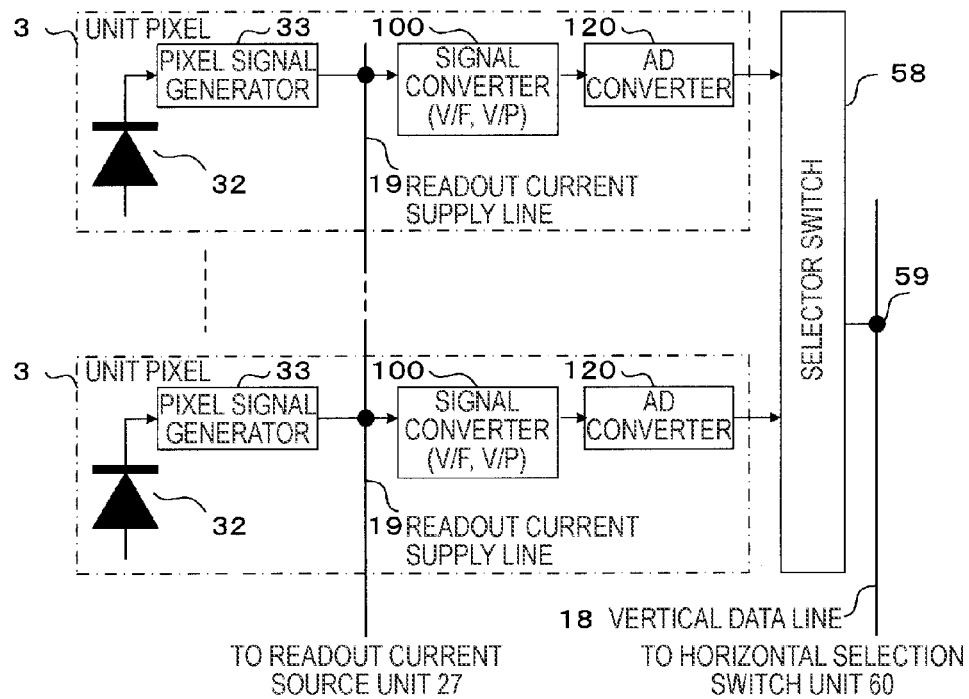
FIGS. 11A and 11B are diagrams for explaining a CMOS solid-state imaging device that is a form of a physical information acquiring device in a second example of the fourth embodiment of the invention.
Figure 11B:
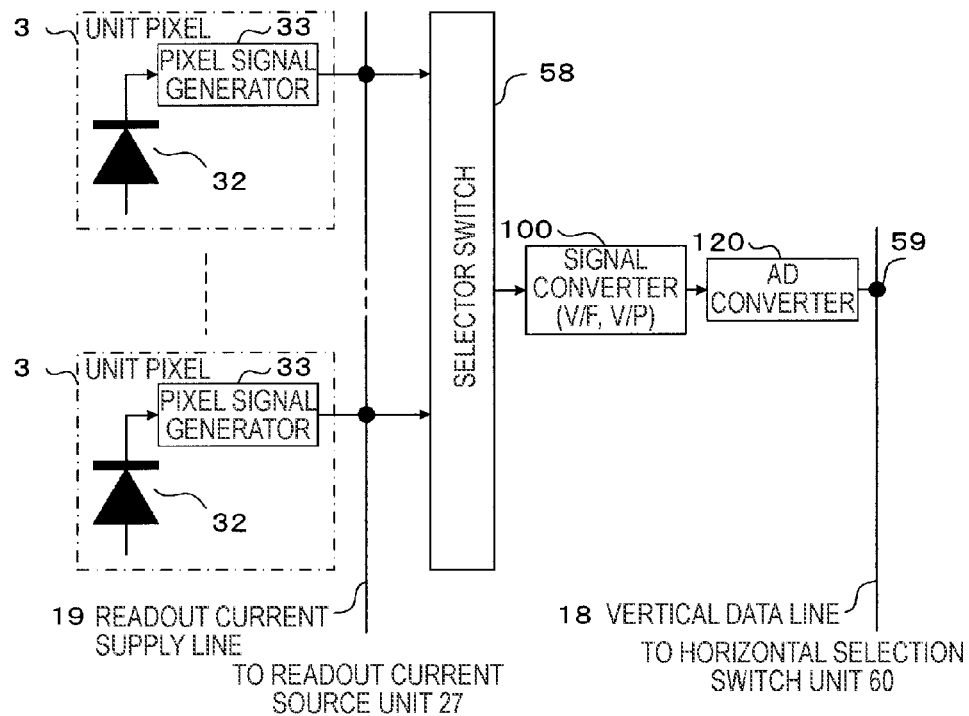

Schematic Constitution of an Imaging Apparatus; Fourth Embodiment; Second Example FIGS. 11A and 11B are diagrams for explaining the CMOS solid-state imaging device that is a form of the physical information acquiring device in a second example of the fourth embodiment of the invention. The second example is described as a modification to the second example of the third embodiment.

The solid-state imaging device 1 in the second example of the fourth embodiment has a characteristic in that the signal converter 100 and the AD converter 120 are built in the imaging area 10 and one selection switch in the horizontal selection switch unit 60 is allocated to the charge generators 32 and the pixel signal generators 33 in plural vertical columns.

In this case, in order to allocate one selection switch to the plural charge generators 32 and the plural pixel signal generators 33, the selector switch 58 is provided between an output side of the unit pixels 3 and the vertical data line 18. A count value (by the AD converter 120) selected by the selector switch 58 is supplied to the selection switch via the vertical data line 18. A control signal designating a readout row is inputted to the selector switch 58 as a switching control signal.

Therefore, although not shown in the figure, selection switches, the number of which is decided taking into account the selection switch to be allocated, are provided in the horizontal selection switch unit 60. As a constitution in which the number of selection switches is maximized, it is possible to allocate one signal converter 100 and one AD converter 120 to two charge generators 32 and two pixel signal generators 33. As a constitution in which the number of selection switches is minimized, it is possible to allocate one selection switch to the charge generators 32 and the pixel signal generators 33 in all vertical columns.

One selection switch only has to be allocated to the plural charge generators 32 and the plural pixel signal generators 33. As shown in FIG. 11A, it is also possible to provide the signal converters 100 and the AD converters 120 in the respective pixels and arrange the selector switch 58 at the post stage of the respective AD converters 120. In this case, the selector switch 58 has a function of a selection switching unit that allocates one output terminal 59 or allocating one selection switch in the horizontal selection switch unit 60 to the plural AD converters 120.

Alternatively, as shown in FIG. 11B, it is also possible to reduce the number of signal converters 100 and the number of AD converters 120 by arranging the selector switch 58 at a pre-stage of the signal converters 100. In this case, the selector switch 58 has a function of a selection switching unit that allocates the single output terminal 59 or allocates the one signal converter 100 and the one AD converter 120, that is, one selection switch in the horizontal selection switch unit 60, to the plural unit pixels 3.

Although not shown in the figure, an intermediate form between those shown in FIGS. 11A and 11B, it is also possible to reduce the number of AD converters 120 by providing the signal converters 100 in the respective unit pixels 3 and arranging the selector switch 58 between the plural signal converters 100 and one AD converter 120. In this case, the selector switch 58 has a function of a selection switching unit that allocates the single output terminal 59 or allocating one AD converter 120, that is, one selection switch in the horizontal selection switch unit 60, to the plural signal converters 100.

If the constitution in the fourth embodiment is adopted, regardless of the first example and the second example, a counter value, that is, an AD conversion result corresponding to a signal charge acquired by each of the unit pixels 3 is transmitted to the horizontal selection switch unit 60 provided outside the imaging area 10 and immediately transferred to the output unit 88. This is a mechanism that is the same as the mechanism of information transmission by the human eyes.

Operations of the signal converter 100 and the AD converter 120 are the same as those in the first embodiment. In this fourth embodiment, as in the first embodiment, it is possible to acquire a count result and complete the AD conversion processing substantially simultaneously with a point when the pixel signal voltage Vx read out from the imaging area 10 is stabilized. This makes it possible to remarkably reduce time for the AD conversion processing.

Since not only the signal converter 100 but also the AD converter 120 is arranged in the imaging area 10, it is possible to realize an effect that cannot be obtained in the constitution adopted in the past.

However, as it is seen from FIG. 10 and FIGS. 11A and 11B, since the AD converter 120 is also built in the imaging area 10 on the basis of the constitution in the third embodiment, it is more difficult to realize high density. A size of the unit pixels 3 increases because of the addition of the signal converter 100 and the AD converter 120. In the second example, since it is necessary to arrange the selector in the imaging area 10, an area of the entire imaging area 10 also increases. This makes it difficult to realize high density.

As in the third embodiment, it is necessary to arrange the readout current supply lines 19 other than the vertical data lines 18 for signal readout. Thus, in forming a wiring layer that forms wiring to active elements of the imaging area 10, the readout current supply lines 19 may be a factor in blocking light in a surface sensor having a usual pixel structure of the surface light receiving type that takes light into a photoelectric conversion element from the same surface side as the wiring layer.

In order to solve these problems, as described in the third embodiment, a sensor structure of a back-illuminated type only has to be adopted. However, even when the sensor structure of the back light receiving type is adopted, in order to prevent an increase in a size as the imaging area 10 as a whole while reducing the number of wirings on the opposite side of a light incidence surface and the number of layers for circuit members, it is preferable to reduce circuit sizes of the signal converter 100, the AD converter 120, and the selector switch 58. It is considered appropriate to adopt the constitution shown in FIG. 11B that can reduce the number of signal converters 100 and the number of AD converters 120.

Schematic Constitution of an Imaging Apparatus; Fifth Embodiment

Figure 12A:
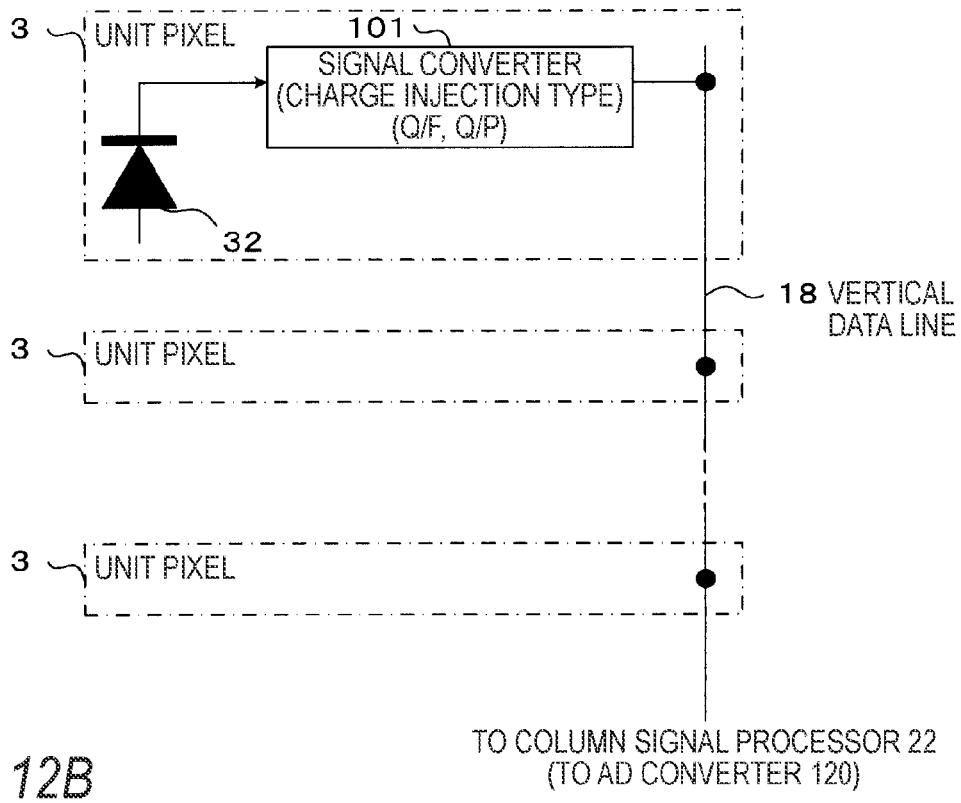
FIGS. 12A and 12B are diagrams for explaining a CMOS solid-state imaging device that is a form of a physical information acquiring device according to a fifth embodiment of the invention.
Figure 12B:
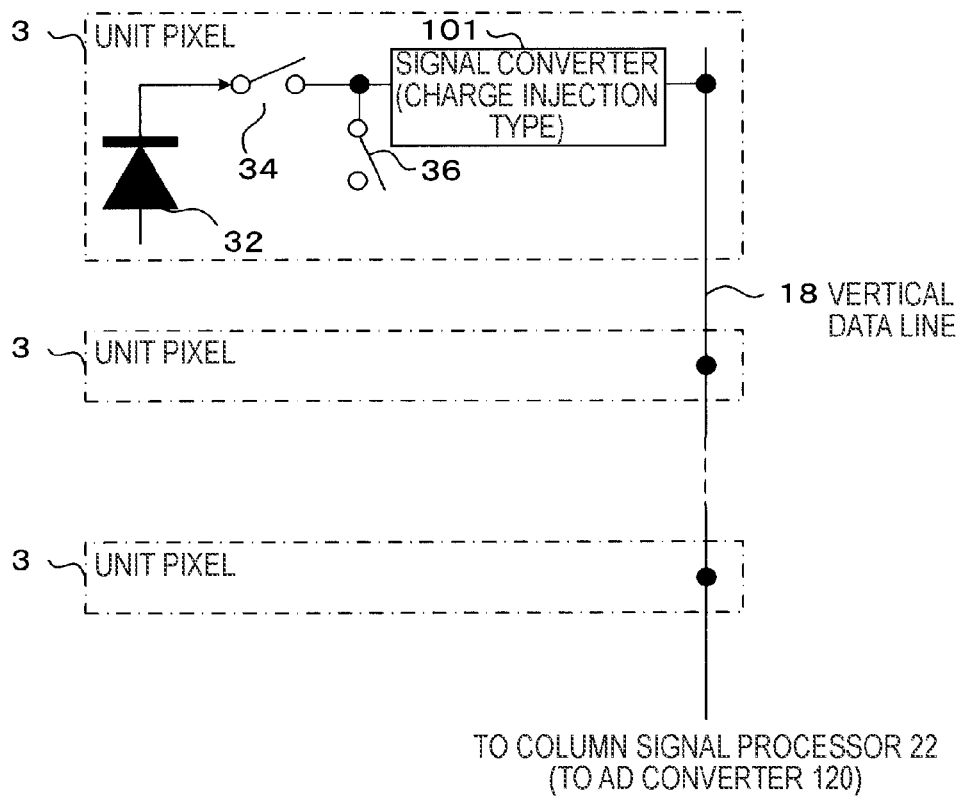

FIGS. 12A and 12B are diagrams for explaining a CMOS solid-state imaging device that is a form of a physical information acquiring device according to a fifth embodiment of the invention. The fifth embodiment is described as a modification to the first example of the third embodiment. However, it is also possible to apply a modified form explained below to the second example of the third embodiment and the first and the second examples of the fourth embodiment in the same manner.

The fifth embodiment has a characteristic in that a signal converter 101 that directly performs signal conversion by FM modulation or PM modulation on the basis of a signal charge generated by the charge generator 32 is provided. In order to directly perform the FM modulation or the PM modulation, as shown in FIG. 10A, the signal converter 100 only has to be formed as a modulation circuit of a charge injection type. In other words, the signal converter 100 only has to have a function of converting a carrier signal into a modulated signal related to a frequency on the basis of a signal charge and only has to include a charge/frequency converter (Q/F) serving as a frequency modulator that modulates the frequency f itself of the carrier signal according to a signal charge serving as a modulated signal or a charge/phase converter (Q/P) serving as a phase modulator that modulates the phase y according to a signal charge serving as a modulated signal.

As shown in FIG. 10B, if necessary, it is advisable to provide the readout selection transistor 34 serving as a switch for transferring a signal charge generated by the charge generator 32 to the signal converter 100 between the charge generator 32 and the signal converter 100. The reset transistor 36 serving as a reset gate unit that discharges a charge may be provided.

In both the third and the fourth embodiments, a signal charge generated by the charge generator 32 is converted into a pixel signal of a voltage mode by the pixel signal generator 33 and, then, a carrier signal is converted into a signal related to a frequency. Thus, although it is possible to use an FM modulation circuit or a PM modulation circuit using a general-purpose VCO, a circuit configuration is redundant.

On the other hand, in the fifth embodiment, the FM modulation or the PM modulation is directly performed on the basis of a signal charge generated by the charge generator 32. Thus, it is possible to make a circuit configuration compact.

Sensor Structure of a Back-Illuminated Type; Sectional View

Figure 13A:
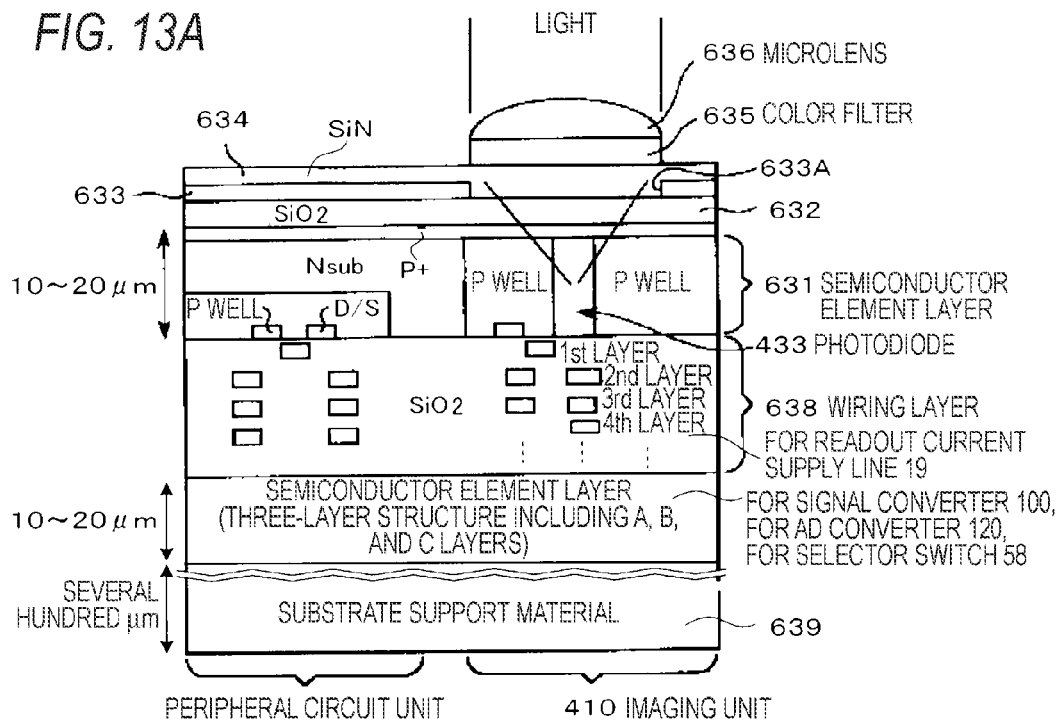
FIGS. 13A and 13B are sectional views showing an example of an imaging area 10 of structures of a back-illuminated type and a peripheral circuit unit suitable in realizing the third to the fifth embodiments.
Figure 13B:
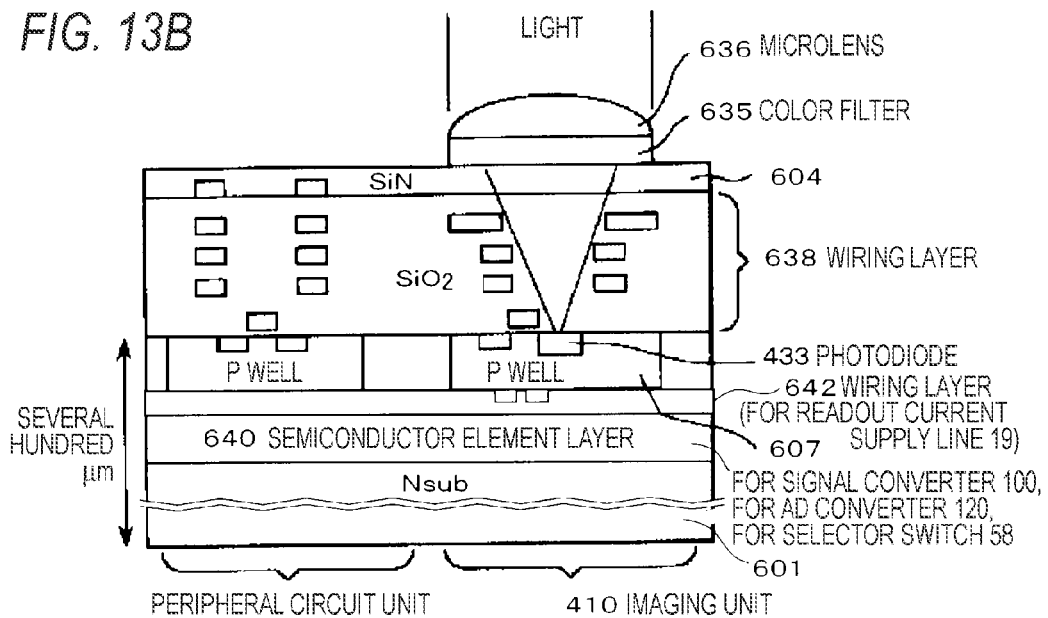
Figure 14:
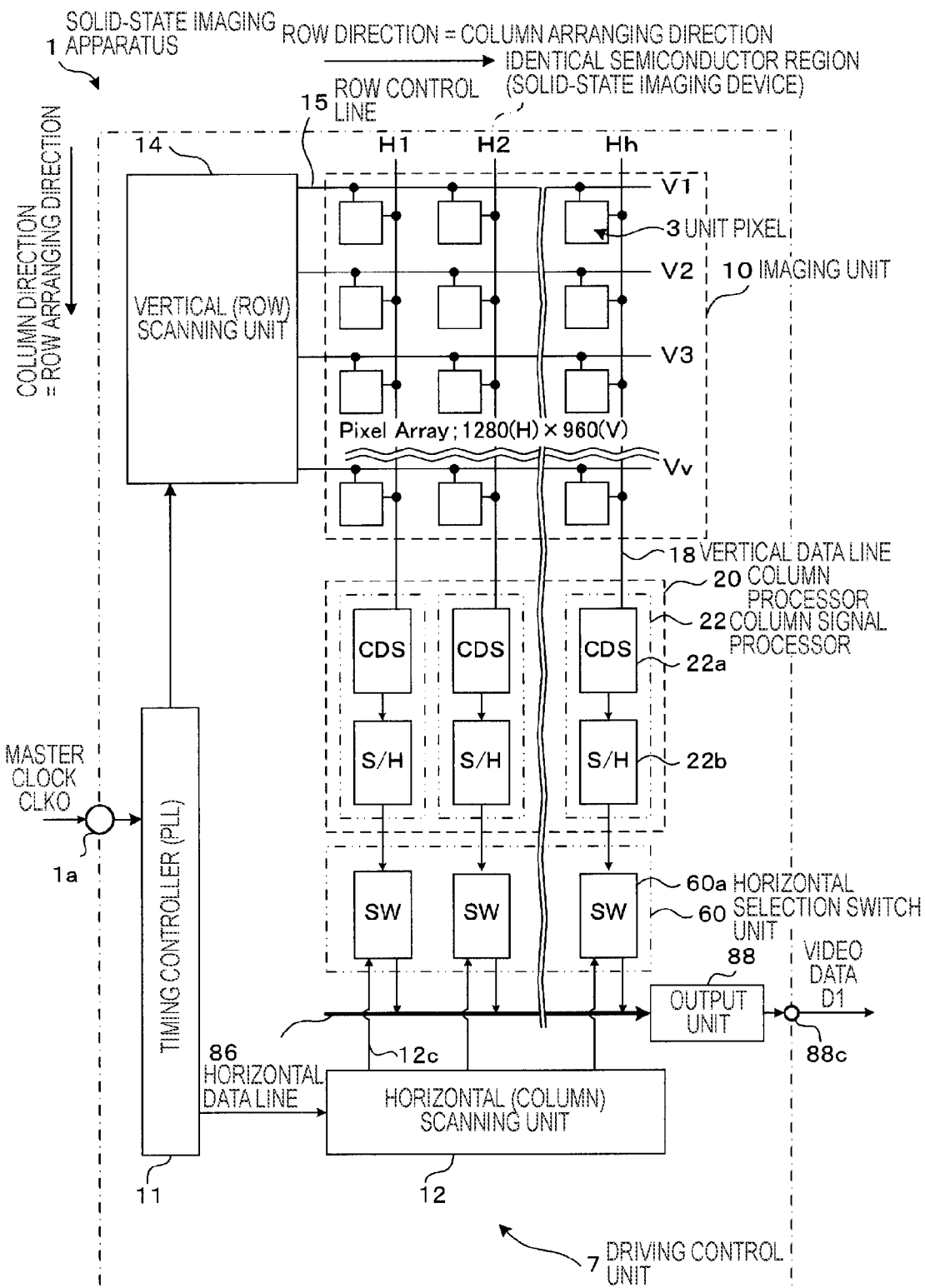
FIG. 14 is a schematic diagram of a solid-state imaging device of a column readout system.
Figure 15:
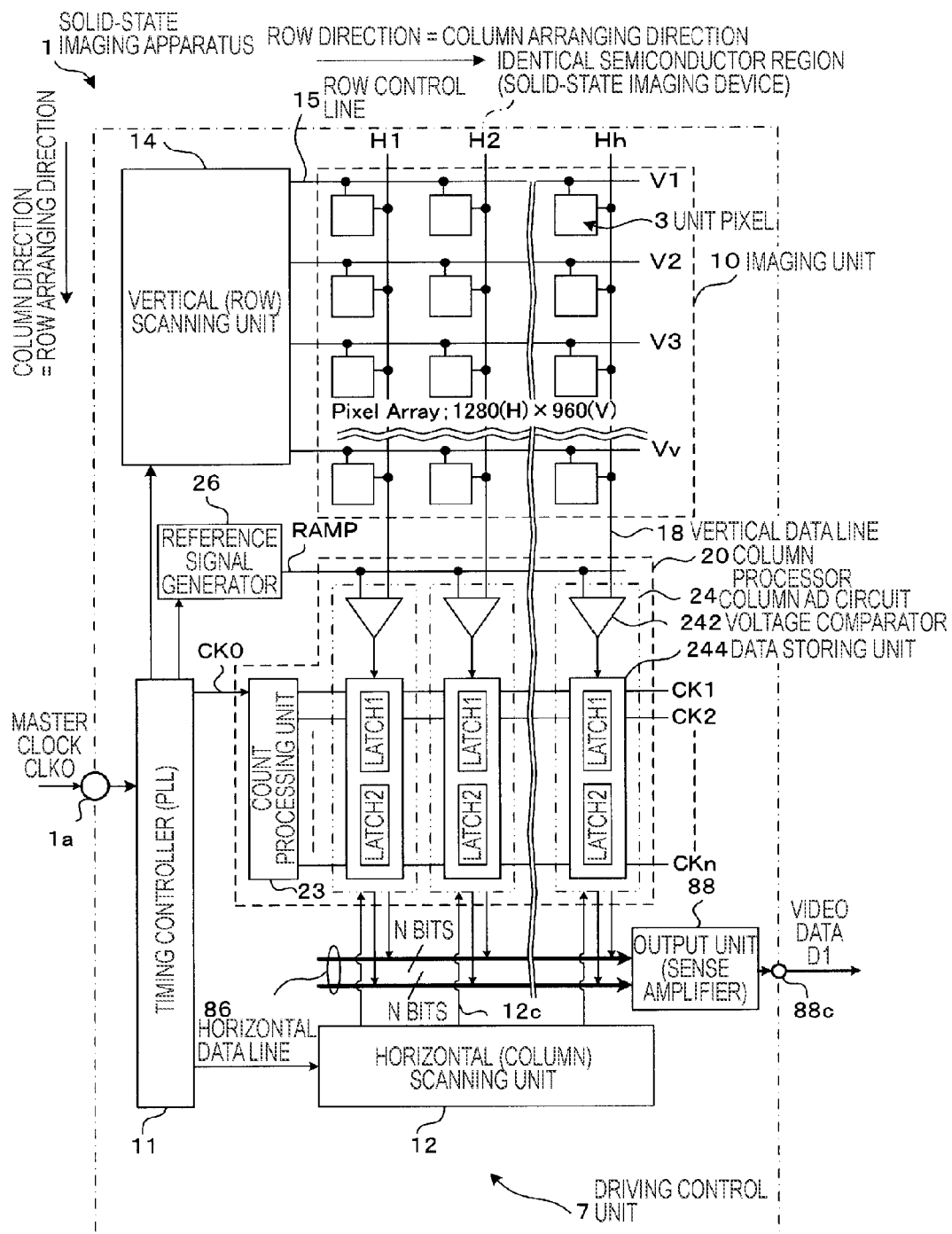
FIG. 15 is a schematic diagram of a solid-state imaging device of a column ADC system.

FIGS. 13A and 13B are sectional views showing an example of an imaging area 10 of structures of a back-illuminated type and a peripheral circuit unit suitable in realizing the third to the fifth embodiments. In FIG. 13A, a semiconductor element layer 631 made of silicon (Si) with thickness of about 10 μm to 20 μm is formed as a semiconductor element layer for the charge generator 32 or the pixel signal generator 33 by polishing a wafer with Chemical Mechanical Polishing (CMP). A desirable range of the thickness is 5 μm to 15 μm for visible light, 15 μm to 50 μm for infrared light, and 3 μm to 7 μm for ultraviolet light. On one surface side of the semiconductor element layer 631, a light shielding film 633 is formed with an $SiO_2$ film 632 held between the semiconductor element layer 631 and the light shielding film 633.

Unlike wiring, the light shielding film 633 is laid out tanking into account only optical elements. An opening 633A is formed in the light shielding film 633. A silicon nitride film (SiN) 634 is formed on the light shielding film 633 as a passivation film. A color filter 635 and a microlens 636 are formed above the opening 633A. As a pixel structure, light made incident on one surface side of the semiconductor element layer 631 is guided to a light-receiving surface of a photodiode 433 formed in the semiconductor element layer 631 through the microlens 636 and the color filter 635. A wiring layer 638 in which a transistor and a metal wiring are formed is provided on the other surface side of the semiconductor element layer 631. A substrate support material 639 having thickness of about 100 μm is further stuck under the wiring layer 638.

A first layer in the wiring layer 638 is used as wiring in pixels. A second layer is used as wiring in a longitudinal direction for the vertical data lines 18 and drain lines. A third layer is used as wiring in a lateral direction for the transfer gate wiring (the readout selection line TRG) 55, the reset wiring (RST) 56, the vertical selection line (VSEL) 57 for row address setting, and the like.

In realizing the third and the fourth embodiments, the wiring in the longitudinal direction is not limited to the vertical data lines 18. The readout current supply lines 19 are also arranged. The readout current supply lines 19 are lines for forming, when a signal is read out, a source follower between load MOS transistors in the readout current source unit 27 and the amplification transistors 42 in a selected row to continue to feed a constant current decided in advance to the amplification transistor 42 using the load MOS transistors connected to the respective amplification transistors 42.

A fourth layer is provided in the wiring layer 638 as a layer for the readout current supply line 19. Even if the number of layers is increased in the wiring layer 638, optical design on the light-receiving surface side is not affected at all. In this regard, when the number of layers is increased, the sensor structure of the back-illuminated type is significantly different from a sensor structure of the surface light receiving type that affects optical design on a light-receiving surface side. It goes without saying that the vertical data lines 18 may be arranged in the fourth and subsequent layers. In this case, it is possible to reduce the number of wirings in the second layer and realize refining of pixels.

A semiconductor element layer 640 made of silicon (Si) or the like having thickness of about 10 μm to 20 μm is formed between the wiring layer 638 and the substrate support material 639 as a semiconductor element layer for the signal converter 100, the AD converter 120, and the selector switch 58. It is not essential that all of the signal converter 100, the AD converter 120, and the selector switch 58 are provided in an identical semiconductor element layer. At least the signal converter 100, the AD converter 120, and the selector switch only have to be formed in an arbitrary number of semiconductor element layers on the opposite side of the light-receiving surface side. For example, it is also possible that the semiconductor element layer 640 is formed in a three-layer structure including layers 640a, 640b, and 640c and the signal converter 100, the AD converter 120, and the selector switch 58 are provided in the separate semiconductor element layers 640a, 640b, and 640c. Even if the semiconductor element layer 640 is provided in this way, optical design on the light-receiving surface side is not affected at all. In this regard, the sensor structure of the back-illuminated type is significantly different from a sensor structure of the surface light receiving type that affects optical design on a light-receiving surface side when the circuit member is arranged on the light-receiving surface side.

The CMOS image sensor in the past adopts a pixel structure of the surface light receiving type in which a wiring layer side is set as a surface side and incident light is taken in from this wiring layer side. In the element structure of the back-illuminated type described above, incident light is taken in from a surface (back) side on the opposite side of the wiring layer 638 and the semiconductor element layer 640.

As it is seen from this pixel structure of the back light receiving type, the light shielding film 633 is only present as a metal layer between the microlens 636 and the photodiode 433 and height of the light shielding film 633 from the photodiode 433 is as low as thickness of the $SiO_2$ film 632 (e.g., about 0.5 μm). Thus, it is possible to eliminate a limitation of condensing due to eclipse in the metal layer.

As it is seen from FIG. 13A, the pixel structure of the back light receiving type for taking light in from a surface on the opposite side (the back side) of the wiring layer is adopted. Thus, it is possible to lay wiring and arrange circuit members on a photoelectric conversion element area such as a photodiode without worrying about the problem of light blocking by the wiring and the circuit members in the semiconductor element layer 640.

As it is also seen from FIG. 13A, since the wiring layer 638 is not present on the light-receiving surface side, it is possible to form the light shielding film 633, the color filter 635, and the microlens 636 in low positions with respect to the light-receiving surface. Thus, the pixel structure of the back light receiving type is also advantageous concerning sensitivity, color mixture, limb darkening, and the like.

In the sensor structure of the back-illuminated type described in this example, not only the readout current supply lines 19 but also the other wirings (the wiring in the pixels, the wiring in the longitudinal direction excluding the readout current supply lines 19, and the wiring in the lateral direction) are arranged on the surface on the opposite side of the side where incident light is taken into the photoelectric conversion element. However, this is not essential. In other words, in realizing the third or the fourth embodiment, the sensor structure of the back-illuminated type only has to be applied to the readout current supply lines 19 that may be required to be provided separately from the vertical data lines 18. In this case, when the sensor structure of the back-illuminated type is transformed on the basis of the sensor structure of the surface-illuminated type, a layer structure shown in FIG. 13B is obtained.

For example, when a sensor that is already optically designed as a sensor of the surface type is diverted to be used as a global shutter (in high speed) in a state in which the sensor has compatibility of characteristics, it is possible to use the sensor structure for, for example, isolating control lines serving as a digital system and vertical data lines serving as an analog system on the surface and the back.

It is not impossible to arrange the semiconductor element layer 640 for the signal converter 100, the AD converter 120, and the selector switch 58 and the wiring layer 642 for the readout current supply line 19 on the opposite side of the light-receiving surface and arrange the wiring layer 638 for the other wirings (the wiring in the pixels, the wiring in the longitudinal direction, and the wiring in the lateral direction) is arranged on the light-receiving surface side with the semiconductor element layer 631, in which the photodiode 433 and the like are formed, held between the wiring layer 642 and the wiring layer 638. However, as an actual problem, the number of steps increases.

The invention has been explained using the embodiments. However, the technical scope of the invention is not limited to the scope described in the embodiments. It is possible to apply various modifications and alterations to the embodiments without departing from the spirit of the invention. Forms after such modifications and alterations are also included in the technical scope of the invention.

The embodiments do not limit the inventions according to claims. All combinations of the characteristics explained in the embodiments are not always essential for means for solving the problems. The embodiments described above include inventions at various stages. It is possible to extract various inventions according to an appropriate combination in the plural elements disclosed in this specification. Even if several elements are deleted from all the elements described in the embodiments, a constitution with the several elements deleted can be extracted as an invention.

For example, in the examples explained in the embodiments, the invention is applied to the apparatus of the row unit readout system (the column readout system) that performs electronic control of an exposure time in which accumulation of signal charges corresponding to incident light is started for each line (row) and signals of an electric current or a voltage based on the signal charges accumulated are read out from the imaging area in order as pixel signals of the respective pixels according to address designation. However, in a system in which accumulation of signal charges corresponding to incident light is started for each pixel, as in the embodiments, it is possible to convert a carrier signal into a signal related to a frequency on the basis of the signal charges accumulated and use the signal related to a frequency to acquire physical information for a predetermined purpose.

In the embodiments, the CMOS solid-state imaging device having sensitivity to light and electromagnetic waves inputted from the outside such as radiations is described as an example. However, it is possible to apply the mechanisms explained in the embodiments to all physical quantity distribution detectors of a type for determining an accumulation time and a readout point in time of pixels according to address setting that detect a change in a physical quantity. It is also possible to apply the mechanisms to semiconductor devices having a structure not including a unit signal generator in a unit component like a Charge Coupled Device (CCD).

Not only in the mechanisms for grasping a change in a physical quantity with light but also other mechanisms for detecting a physical change such as a fingerprint authentication apparatus that detects an image of a fingerprint on the basis of a change in an electric characteristic based on a pressure and a change in an optical characteristic (see JP-A-2002-7984, JP-A-2001-125734, etc.), it is possible to convert a carrier signal into a signal related to a frequency on the basis of information on a physical quantity change detected by a detector and use the signal related to a frequency to acquire physical information for a predetermined purpose.

According to the embodiments of the invention, a carrier signal is converted into a signal related to a frequency (a modulated signal) on the basis of change information detected by the detector to acquire physical information for a predetermined purpose using the modulated signal.

The change information detected by the detector is not transmitted to an output side as a signal in a voltage mode or a current mode but is transmitted after being converted into a modulated signal related to a frequency. Thus, even if an amplitude, a frequency, or a phase of the carrier signal (the modulated signal) fluctuates when the signal is transmitted, the fluctuation affects a signal carried by the modulated signal less, the signal is less easily affected by a substrate bias effect, a wiring length, a wiring capacity, a gate total capacity, and the like, and a deterioration amount of an SN ratio (a ratio of signal power to noise power) at the time when an input signal on a reception side weakens is small, and a noise resistance property is satisfactory.

Since the AD conversion processing is performed in the AD conversion processor in the pulse count processing using a modulated wave generated in the signal converter, it is possible to efficiently perform the AD conversion processing. In addition, even when a counter clock or a gate signal used in the count processing for AD conversion is wired to the AD conversion processor, it is easy to adopt a mechanism for lowering a frequency of the counter clock or the gate signal. It is possible to easily reduce the problem of noise and power consumption due to the wiring.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:
   an imaging region which includes a plurality of pixels, each having a photoelectric converter that converts light into electric charges;
   a signal converter portion in which at least one image signal from the plurality of pixels is converted into an electrical signal related to a frequency of an incident light; and
   a wiring layer portion between the signal converter portion and the imaging region in a sectional view, the wiring layer portion including a plurality of wiring layers arranged along a longitudinal direction of the solid-state imaging device, the longitudinal direction being orthogonal to a surface via which the incident light is received,
   wherein,
   the signal converter portion is disposed between a substrate support material and the wiring layer portion and the incident light is first received by the device via the imaging region.

2. The solid-state imaging device of claim 1, wherein a first wiring layer of the wiring layer portion is used as wiring in pixels.

3. The solid-state imaging device of claim 1, wherein a second wiring layer of the wiring layer portion is used as wiring in a longitudinal direction for a vertical data line and drain line.

4. The solid-state imaging device of claim 1, wherein a third wiring layer of the wiring layer portion is used as wiring in a lateral direction for a transfer gate.

5. The solid-state imaging device of claim 1, wherein a fourth wiring layer of the wiring layer portion is used as wiring for a readout current supply line.

6. A camera apparatus comprising a solid-state imaging device, the solid-state imaging device comprising:
   an imaging region which includes a plurality of pixels, each having a photoelectric converter that converts light into electric charges;
   a signal converter portion in which at least one image signal from the plurality of pixels is converted into an electrical signal related to a frequency of an incident light; and
   a wiring layer portion between the signal converter portion and the imaging region in a sectional view, the wiring layer portion including a plurality of wiring layers arranged along a longitudinal direction of the solid-state imaging device, the longitudinal direction being orthogonal to a surface via which the incident light is received,
   wherein,
   the signal converter portion is disposed between a substrate support material and the wiring layer portion and the incident light is first received by the device via the imaging region.

7. The camera apparatus of claim 6, wherein a first wiring layer of the wiring layer portion is used as wiring in pixels.

8. The camera apparatus of claim 6, wherein a second wiring layer of the wiring layer portion is used as wiring in a longitudinal direction for a vertical data line and drain line.

9. The camera apparatus of claim 6, wherein a third wiring layer of the wiring layer portion is used as wiring in a lateral direction for a transfer gate.

10. The camera apparatus of claim 6, wherein a fourth wiring layer of the wiring layer portion is used as wiring for a readout current supply line.

* * * * *